United States Patent
Yamauchi

(10) Patent No.: US 7,939,890 B2
(45) Date of Patent: May 10, 2011

(54) SEMICONDUCTOR DEVICE HAVING TRANSISTOR AND CAPACITOR OF SOI STRUCTURE AND STORING DATA IN NONVOLATILE MANNER

(75) Inventor: Tadaaki Yamauchi, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 407 days.

(21) Appl. No.: 12/155,346

(22) Filed: Jun. 3, 2008

(65) Prior Publication Data

US 2008/0316826 A1  Dec. 25, 2008

(30) Foreign Application Priority Data

Jun. 19, 2007  (JP) ................. 2007-161370

(51) Int. Cl.
*G11C 11/34* (2006.01)
*H01L 29/94* (2006.01)
(52) U.S. Cl. .................. 257/347; 365/185.13
(58) Field of Classification Search .................. 257/347
See application file for complete search history.

(56) References Cited

U.S. PATENT DOCUMENTS

| | | | | |
|---|---|---|---|---|
| 4,814,846 A * | 3/1989 | Matsumoto et al. | .......... | 257/446 |
| 5,592,009 A * | 1/1997 | Hidaka | .......... | 257/351 |
| 5,969,998 A * | 10/1999 | Oowaki et al. | .......... | 365/189.09 |
| 5,978,265 A * | 11/1999 | Kirisawa et al. | .......... | 365/185.17 |
| 6,617,651 B2 * | 9/2003 | Ohsawa | .......... | 257/366 |
| 6,775,177 B2 * | 8/2004 | Okamoto et al. | .......... | 365/149 |
| 7,095,076 B1 * | 8/2006 | Han et al. | .......... | 257/319 |
| 7,130,213 B1 * | 10/2006 | Raszka | .......... | 365/149 |
| 7,262,993 B2 * | 8/2007 | Taguchi | .......... | 365/185.08 |
| 7,440,310 B2 * | 10/2008 | Bhattacharyya | .......... | 365/149 |
| 7,710,771 B2 * | 5/2010 | Kuo et al. | .......... | 365/184 |
| 2004/0021137 A1 * | 2/2004 | Fazan et al. | .......... | 257/1 |
| 2008/0203443 A1 * | 8/2008 | Wilson et al. | .......... | 257/260 |

OTHER PUBLICATIONS

Tadaaki Yamauchi et al., "High-Performance Embedded SOI DRAM Architecture for the Low-Power Supply," Aug. 2000, IEEE Journal of Solid-State Circuits, pp. 1169-1178.*

Raszka, Jaroslav et al., "Embedded Flash Memory for Security Applications in a 0.13 um CMOS Logic Process," ISSCC 2004, Session 2, Non-Volatile Memory, IEEE, 2004.

* cited by examiner

*Primary Examiner* — N Drew Richards
*Assistant Examiner* — Robert Carpenter
(74) *Attorney, Agent, or Firm* — McDermott Will & Emery LLP

(57) ABSTRACT

In a semiconductor device, a first transistor of an SOI structure has a source region, a drain region, a body region positioned between the source region and the drain region, and a gate electrode positioned above the body region. A first capacitor of the SOI structure has a first terminal electrically connected to a gate electrode of the first transistor, and a second terminal. The semiconductor device stores data in a nonvolatile manner in accordance with carriers accumulated in a first node electrically connecting the gate electrode of the first transistor and the first terminal of the first capacitor.

3 Claims, 14 Drawing Sheets

SEMICONDUCTOR DEVICE HAVING TRANSISTOR AND CAPACITOR OF SOI STRUCTURE AND STORING DATA IN NONVOLATILE MANNER

BACKGROUND OF THE INVENTION

1. Field of the Invention

The present invention relates to a semiconductor device, and in particular, to a semiconductor device that stores data in a nonvolatile manner using transistors or the like formed on an SOI (Silicon on Insulator) substrate.

2. Description of the Background Art

Semiconductor devices capable of storing information by injecting or drawing electrons into/from a floating gate, e.g., flash memory, have been developed. In connection with the flash memory, it is necessary to add a process step of forming the floating gate to normal CMOS (Complementary Metal Oxide Semiconductor) process steps, for example.

In order to eliminate the necessity of adding the process step, for example, Jaroslav Raszka et al., "Embedded Flash Memory for Security Applications in a 0.13 μm CMOS Logic Process", ISSCC 2004, SESSION 2, NON-VOLATILE MEMORY, IEEE, 2004 (Non-Patent Document 1) discloses a nonvolatile memory cell, which includes three elements in total, i.e., a P channel MOS transistor formed on an N type well and two capacitors formed on N type wells, each elements being insulation-isolated by STI (Shallow Trench Isolation). In the nonvolatile memory cell, a coupling node of the gate electrode of the P channel MOS transistor and the two capacitors correspond to the floating gate.

However, in the configuration using a bulk substrate such as the nonvolatile memory cell disclosed by Non-Patent Document 1, it is necessary to insulation-isolate the N type wells on which the three elements are formed and to separately control the applied voltages to the N type wells. As a result, there has been a problem that the cell size is increased and large capacity cannot be attained.

SUMMARY OF THE INVENTION

An object of the present invention is to provide a semiconductor device that is capable of storing data in a nonvolatile manner, avoiding an increase in the number of process steps, and being reduced in size.

In summary, a semiconductor device according to the present invention includes: a first transistor of an SOI (Silicon on Insulator) structure having a source region, a drain region, a body region positioned between the source region and the drain region, and a gate electrode positioned above the body region; and a first capacitor of the SOI structure having a first terminal electrically connected to the gate electrode of the first transistor, and a second terminal. The semiconductor device stores data in a nonvolatile manner in accordance with carriers accumulated in a first node electrically connecting the gate electrode of the first transistor and the first terminal of the first capacitor.

According to the present invention, the first transistor and the first capacitor have the SOI structure. Thus, the substrate potential of each element can independently be controlled without an increase in the cell size. Furthermore, data is stored in a nonvolatile manner in accordance with carriers accumulated in the first node electrically connecting the gate electrode of the first transistor and the first terminal of the first capacitor. This eliminates the necessity of adding a process step of forming a floating gate to normal CMOS process steps.

Therefore, according to the present invention, data can be stored in a nonvolatile manner, an increase in the number of process steps can be prevented, and the size can be made small.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
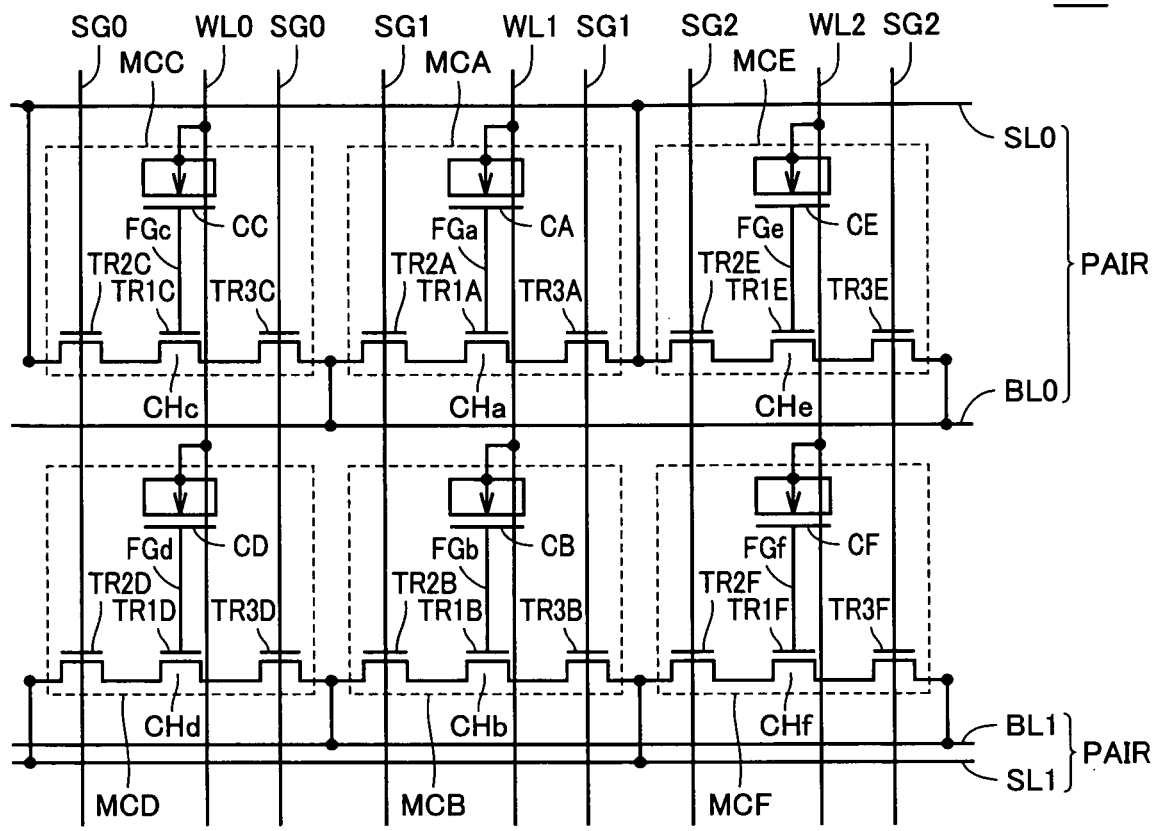
FIG. 1 is a circuit diagram showing a configuration of a semiconductor device 101 according to a first embodiment of the present invention.

In the following, embodiments of the present invention will be described referring to the drawings. In the drawings, the same or corresponding parts are denoted by the same reference character, and description thereof is not repeated.

First Embodiment

Configuration and Basic Operation

FIG. 1 is a circuit diagram showing a configuration of a semiconductor device 101 according to a first embodiment of the present invention. In the following, the extending direction of bit lines BL is referred to as the row direction, and the extending direction of word lines WL is referred to as the column direction.

Referring to FIG. 1, semiconductor device 101 includes a plurality of memory cells arranged in rows and columns, a plurality of bit lines BL and a plurality of source lines SL arranged corresponding to the rows of the memory cell, and a plurality of word lines WL and a plurality of select gate lines SG arranged corresponding to the columns of the memory cell. In FIG. 1, memory cells MCA, MCB, MCC, MCD, MCE, MCF, source lines SL0, SL1, bit lines BL0, BL1, word lines WL0, WL1, WL2, and select gate lines SG0, SG1, SG2 are representatively shown. In the following, a plurality of memory cells may also be generally referred to as memory cell MC, and a plurality of bit lines, source lines, word lines, and select gate lines may also be generally referred to as bit line BL, source line SL, word line WL, and select gate line SG, respectively.

Memory cell MCA includes an MOS capacitor CA and N channel MOS transistors (insulated gate type field-effect transistors) TR1A, TR2A, TR3A. Memory cell MCB includes an MOS capacitor CB and N channel MOS transistors (insulated gate type field-effect transistors) TR1B, TR2B, TR3B. Memory cell MCC includes an MOS capacitor CC and N channel MOS transistors (insulated gate type field-effect transistors) TR1C, TR2C, TR3C. Memory cell MCD includes an MOS capacitor CD and N channel MOS transistors (insulated gate type field-effect transistors) TR1D, TR2D, TR3D. Memory cell MCE includes an MOS capacitor CE and N channel MOS transistors (insulated gate type field-effect transistors) TR1E, TR2E, TR3E. Memory cell MCF includes an MOS capacitor CF and N channel MOS transistors (insulated gate type field-effect transistors) TR1F, TR2F, TR3F.

In the following, MOS capacitors CA, CB, CC, CD, CE, CF may be generally referred to as MOS capacitor C. N channel MOS transistors TR1A, TR1B, TR1C, TR1D, TR1E, TR1F may be referred to as N channel MOS transistor TR1. N channel MOS transistors TR2A, TR2B, TR2C, TR2D, TR2E, TR2F may be referred to as N channel MOS transistor TR2. N channel MOS transistors TR3A, TR3B, TR3C, TR3D, TR3E, TR3F may be referred to as N channel MOS transistor TR3. N channel MOS transistors TR1-TR3 may generally be referred to as N channel MOS transistor TR.

In memory cell MCA, MOS capacitor CA has its gate electrode connected to the gate electrode of N channel MOS transistor TR1A, and has its drain, source and body connected to word line WL1. N channel MOS transistor TR1A has its drain connected to source of N channel MOS transistor TR2A, and has its source connected to drain of N channel MOS transistor TR3A. N channel MOS transistor TR2A has its drain connected to bit line BL0, and has its gate connected to select gate line SG1. N channel MOS transistor TR3A has its source connected to source line SL0, and has its gate connected to select gate line SG1. A connection point of the gate electrode of MOS capacitor CA and the gate electrode of N channel MOS transistor TR1A is a floating node FGa corresponding to a floating gate.

In memory cell MCB, MOS capacitor CB has its gate electrode connected to the gate electrode of N channel MOS transistor TR1B, and has its drain, source and body connected to word line WL1. N channel MOS transistor TR1B has its drain connected to source of N channel MOS transistor TR2B, and has its source connected to drain of N channel MOS transistor TR3B. N channel MOS transistor TR2B has its drain connected to bit line BL1, and has its gate connected to select gate line SG1. N channel MOS transistor TR3B has its source connected to source line SL1, and has its gate connected to select gate line SG1. A connection point of the gate electrode of MOS capacitor CB and the gate electrode of N channel MOS transistor TR1B is a floating node FGb corresponding to a floating gate.

The connection configuration of memory cell MCC is similar to memory cell MCA except that word line WL1 is replaced by word line WL0 and select gate line SG1 is replaced by select gate line SG0. The connection configuration of memory cell MCE is similar to memory cell MCA except that word line WL1 is replaced by word line WL2 and select gate line SG1 is replaced by select gate line SG2. The connection configuration of memory cell MCD is similar to memory cell MCB except that word line WL1 is replaced by word line WL0 and select gate line SG1 is replaced by select gate line SG0. The connection configuration of memory cell MCF is similar to memory cell MCB except that word line WL1 is replaced by word line WL2 and select gate line SG1 is replaced by select gate line SG2. In the following, floating nodes FGa, FGb, FGc, FGd, FGe, FGf may generally be referred to as floating node FG.

Figure 2:
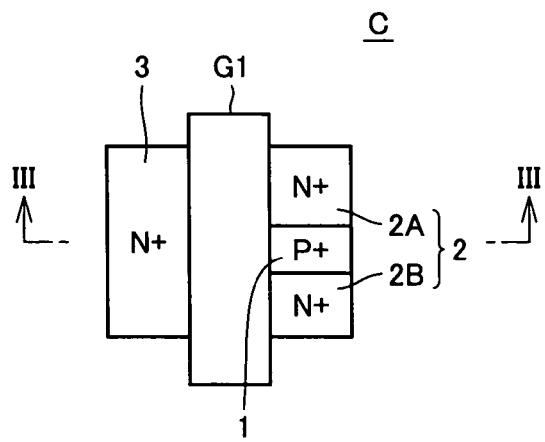
FIG. 2 is a plan view schematically showing a structure of a MOS capacitor C in semiconductor device 101 according to the first embodiment of the present invention.
Figure 3:
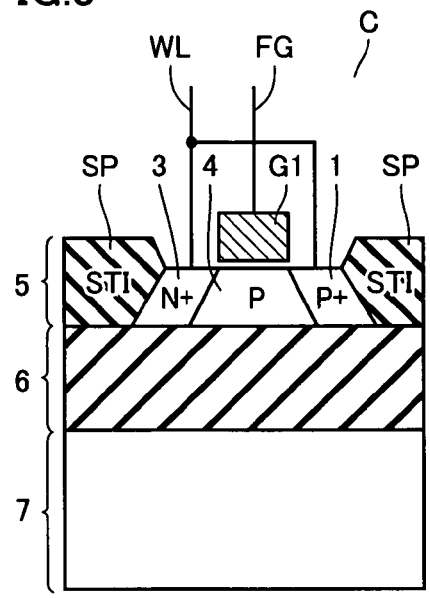
FIG. 3 is a cross-sectional view showing a cross section along III-III in FIG. 2.

FIG. 2 is a plan view schematically showing a structure of MOS capacitor C in semiconductor device 101 according to the first embodiment of the present invention. FIG. 3 is a cross-sectional view showing a cross section along III-III in FIG. 2.

Figure 4:
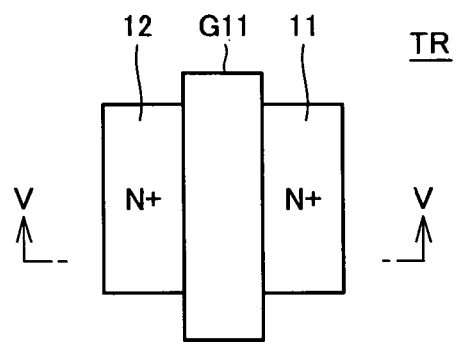
FIG. 4 is a plan view schematically showing a structure of an N channel MOS transistor TR in semiconductor device 101 according to the first embodiment of the present invention.
Figure 5:
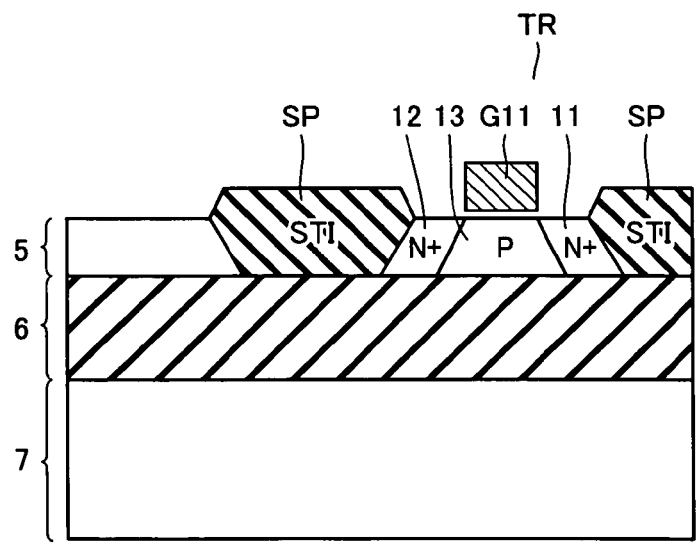
FIG. 5 is a cross sectional view showing a cross section along V-V in FIG. 4.

FIG. 4 is a plan view schematically showing a structure of N channel MOS transistor TR in semiconductor device 101 according to the first embodiment of the present invention. FIG. 5 is a cross sectional view showing a cross section along V-V in FIG. 4.

Referring to FIGS. 3 and 5, MOS capacitor C and N channel MOS transistor TR each have an SOI structure. That is, semiconductor device 101 includes a silicon substrate 7, a buried oxide film 6 that is an insulation film formed on silicon substrate 7, and an active layer 5 formed on oxide film 6. In active layer 5, semiconductor regions of MOS capacitor C and N channel MOS transistor TR, and STI (Shallow Trench Isolation) regions SP are formed.

MOS capacitor C and N-channel MOS transistor TR in semiconductor device 101 according to the first embodiment of the present invention have a complete isolation SOI structure in which active regions corresponding to respective elements are completely isolated by STI regions SP.

Referring to FIGS. 2 and 3, MOS capacitor C includes a P+ type semiconductor region 1, an N+ type semiconductor region 2, an N+ type semiconductor region 3, a P type body region 4, and a gate electrode G1. N+ type semiconductor region 2 includes an N+ type semiconductor region 2A and an N+ type semiconductor region 2B.

P type body region 4 being P type semiconductor region is positioned between N+ type semiconductor region 2 and N+ type semiconductor region 3, and electrically connected to N+ type semiconductor region 2 and N+ type semiconductor region 3. More specifically, P+ type semiconductor region 1 is adjacent to P type body region 4. MOS capacitor C has an interconnection electrically connecting a surface of P+ type semiconductor region 1, a surface of N+ type semiconductor region 2, and a surface of N+ type semiconductor region 3. Thus, P type body region 4 is electrically connected via P+ type semiconductor region 1 to N+ type semiconductor region 2 and N+ type semiconductor region 3. Gate electrode G1 is formed above P type body region 4 with a not-shown gate oxide film, which is an insulation film, being interposed.

When a potential of floating node FG is higher than a potential of word line WL, MOS capacitor C functions as an inversion capacitor. That is, since an N type channel is formed in P type body region 4, a capacitance is generated between P type body region 4 and gate electrode G1. On the other hand, when a potential of floating node FG is lower than a potential of word line WL, MOS capacitor C functions as an accumulation capacitor. That is, since a potential difference is generated between P type body region 4 and gate electrode G1, a capacitance is generated between P type body region 4 and gate electrode G1.

Accordingly, irrespective of the magnitude relationship between the potential of floating node FG and the potential of word line WL, MOS capacitor C can always function as a capacitor.

Semiconductor device 101 performs data writing or data erasing by injecting electrons into floating node FG from P type body region 4, or drawing electrons into P type body region 4, through the gate oxide film by FN (Fowler-Nordheim) tunneling.

Referring to FIGS. 4 and 5, N channel MOS transistor TR includes an N+ type semiconductor region 11, an N+ type semiconductor region 12, a P type body region 13 positioned between N+ type semiconductor region 11 and N+ type semiconductor region 12, and a gate electrode G11 positioned above P type body region 13.

Figure 6:
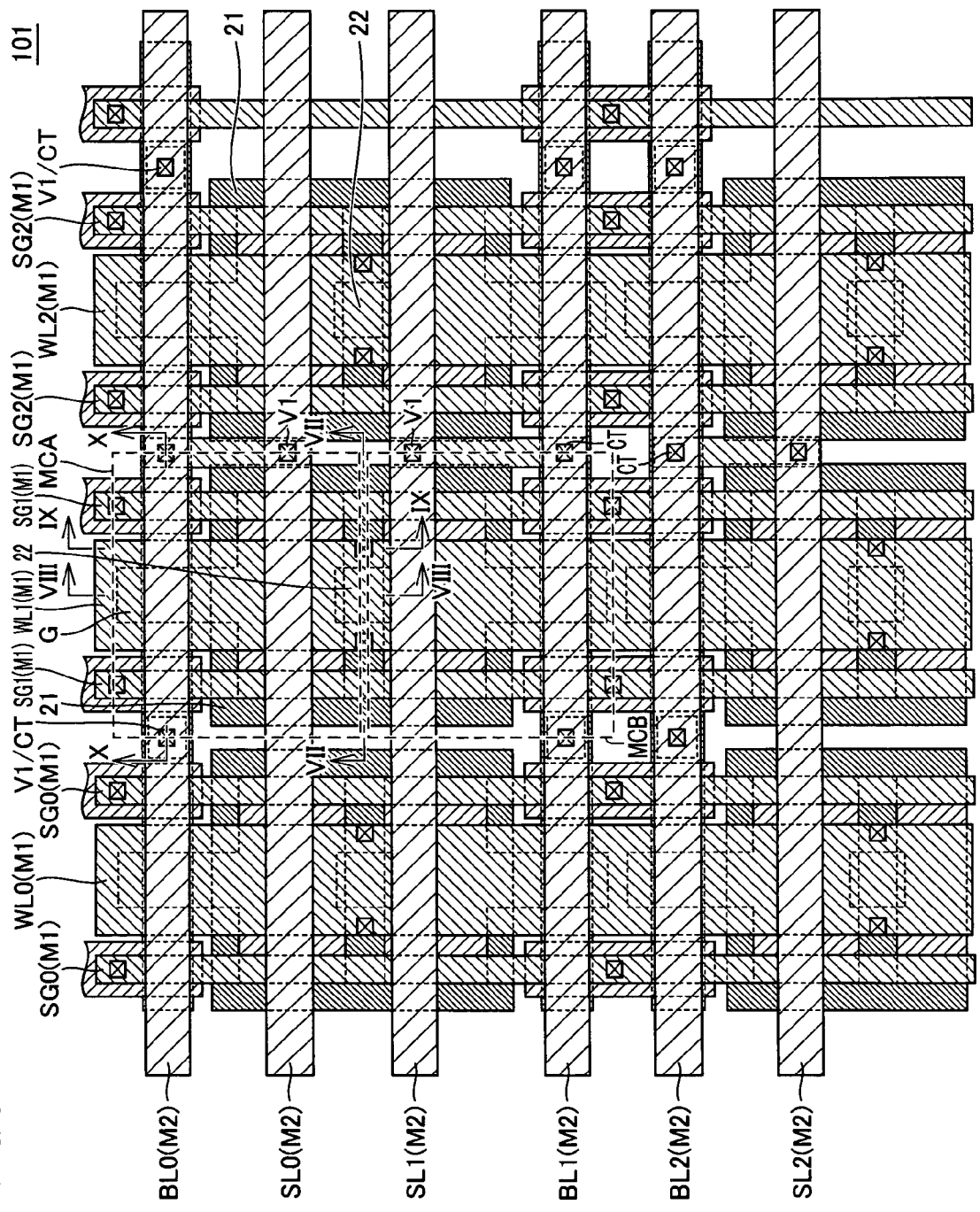
FIG. 6 schematically shows a layout of semiconductor device 101 according to the first embodiment of the present invention.

FIG. 6 schematically shows a layout of semiconductor device 101 according to the first embodiment of the present invention. In FIG. 6, regions corresponding to memory cells MCA and MCB are representatively enclosed by dashed lines, respectively.

Referring to FIG. 6, semiconductor 101 includes an N+ type active region 21 and a P+ type active region 22. N+ type active region 21 and P+ type active region 22 are formed in active layer 5 described above.

Bit lines BL0, BL1, BL2 and source lines SL0, SL1, SL2 are provided in a metal interconnection layer M2 in the row direction. Word lines WL0, WL1, WL2 and select gate lines SG0, SG1, SG2 are provided in a metal interconnection layer M1, positioned lower than metal interconnection layer M2, in the column direction. Source lines SL0, SL1, SL2 are arranged substantially parallel to bit lines BL0, BL1, BL2. Word lines WL0, WL1, WL2 and select gate lines SG0, SG1, SG2 are arranged substantially perpendicularly to bit lines BL0, BL1, BL2.

In memory cell MCA, N channel MOS transistor TR1A is arranged corresponding to the intersection of bit line BL0 and word line WL1. N channel MOS transistors TR2A and TR3A are arranged on both sides of N channel MOS transistor TR1A along bit line BL0. Capacitor CA is arranged corresponding to the intersection of source line SL0 and word line WL1. N channel MOS transistor TR1A and capacitor CA are arranged along word line WL1.

In memory cell MCB, N channel MOS transistor TR1B is arranged corresponding to the intersection of bit line BL1 and word line WL1. N channel MOS transistors TR2B and TR3B are arranged on both sides of N channel MOS transistor TR1B along bit line BL1. Capacitor CB is arranged corresponding to the intersection of source line SL1 and word line WL1. N channel MOS transistor TR1B and capacitor CB are arranged along word line WL1.

The arrangement of each element in memory cell MCC is similar to that in memory cell MCA except that word line WL1 is replaced by word line WL0 and select gate line SG1 is replaced by select gate line SG0. The arrangement of each element in memory cell MCE is similar to that in memory cell MCA except that word line WL1 is replaced by word line WL2 and select gate line SG1 is replaced by select gate line SG2. The arrangement of each element in memory cell MCD is similar to that in memory cell MCB except that word line WL1 is replaced by word line WL0 and select gate line SG1 is replaced by select gate line SG0. The arrangement of each element in memory cell MCF is similar to that in memory cell MCB except that word line WL1 is replaced by word line WL2 and select gate line SG1 is replaced by select gate line SG2.

Figure 7:
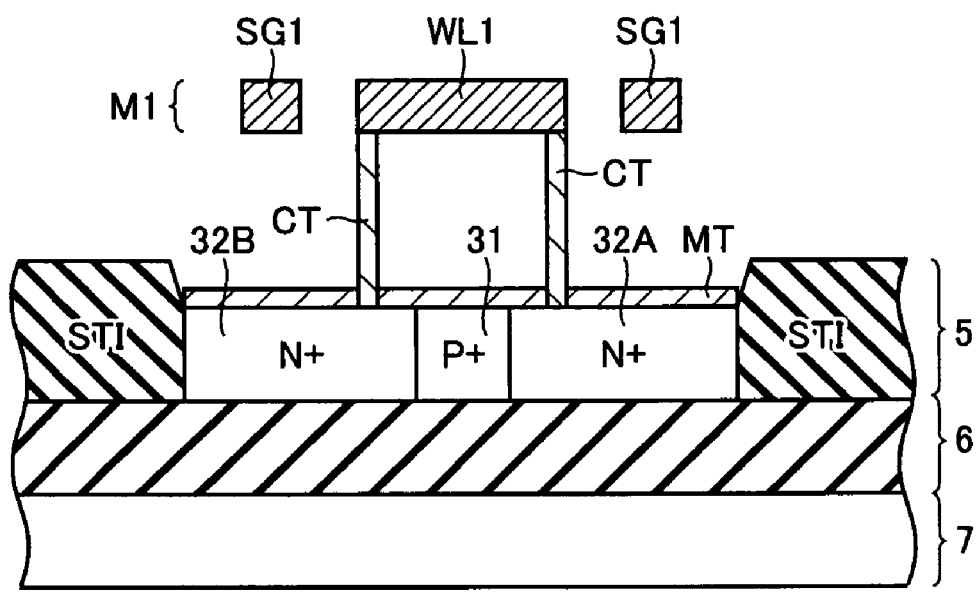
FIG. 7 is a cross-sectional view showing a cross section along VII-VII in FIG. 6.
Figure 8:
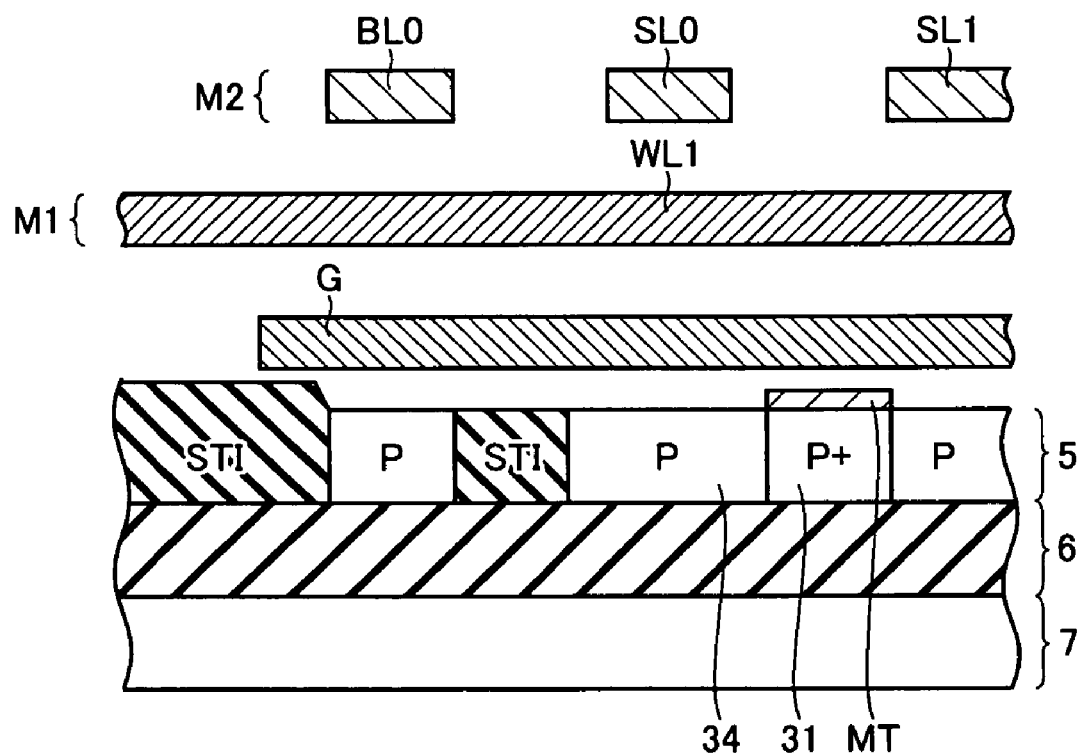
FIG. 8 is a cross-sectional view showing a cross section along VIII-VIII in FIG. 6.
Figure 9:
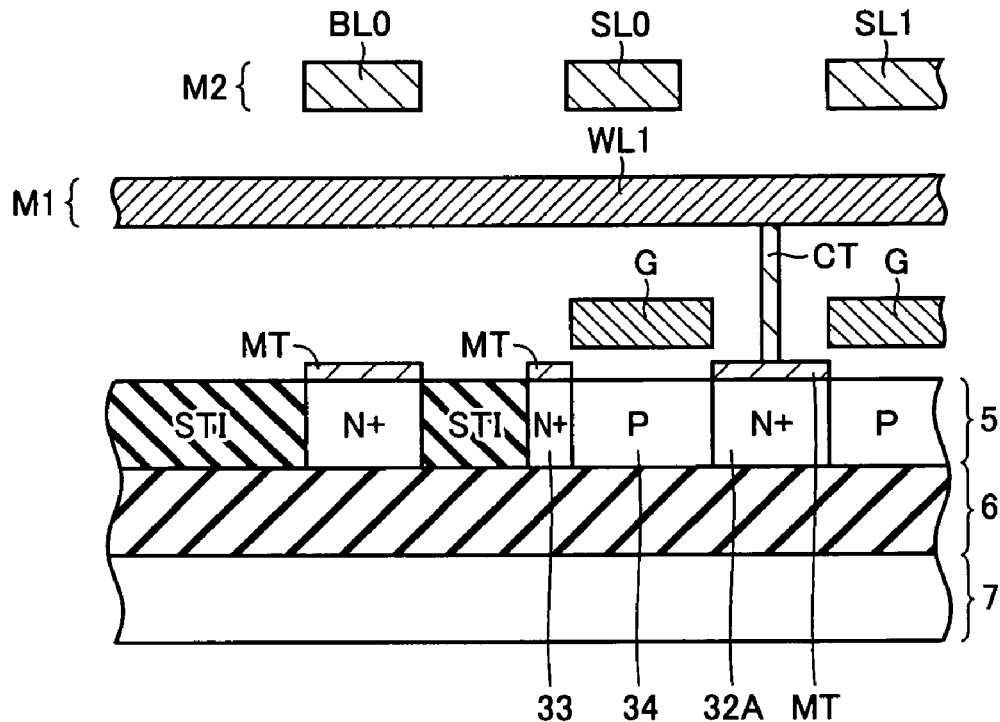
FIG. 9 is a cross-sectional view showing a cross section along IX-IX in FIG. 6.

FIG. 7 is a cross-sectional view showing a cross section along VII-VII in FIG. 6. FIG. 8 is a cross-sectional view showing a cross section along VIII-VIII in FIG. 6. FIG. 9 is a cross-sectional view showing a cross section along IX-IX in FIG. 6.

Referring to FIGS. 7-9, memory cell capacitor CA includes a P+ type semiconductor region 31, an N+ type semiconductor region 32A, an N+ type semiconductor region 32B, an N+ type semiconductor region 33, a P type body region 34 being a P type semiconductor region, and an interconnection layer MT formed by salicide. Interconnection layer MT is formed on P+ type semiconductor region 31, N+ type semiconductor region 32A and N+ type semiconductor region 32B.

P+ type semiconductor region 31, N+ type semiconductor region 32A, N+ type semiconductor region 32B, N+ type semiconductor region 33, and P type body region 34 respectively correspond to P+ type semiconductor region 1, N+ type semiconductor region 2A, N+ type semiconductor region 2B, N+ type semiconductor region 3, and P type body region 4 shown in FIGS. 2 and 3.

P+ type semiconductor region 31 is adjacent to P type body region 34. A surface of P+ type semiconductor region 31, a surface of N+ type semiconductor region 32A, and a surface of N+ type semiconductor region 32B are electrically connected by interconnection layer MT. N+ type semiconductor region 32A, N+ type semiconductor region 32B, and N+ type semiconductor region 33 are not insulation-isolated by STI regions, and are adjacent to one another. Thus, P type body region 34 is electrically connected to N+ type semiconductor region 32A, N+ type semiconductor region 32B, and N+ type semiconductor region 33 via P+ type semiconductor region 31. N+ type semiconductor region 32A and N+ type semiconductor region 32B are connected to word line WL1 via contact CT.

Memory cell capacitor CB shares P+ type semiconductor region 31, N+ type semiconductor region 32A, N+ type semiconductor region 32B and interconnection layer MT with memory cell capacitor CA. The rest of its configuration is the same as memory cell capacitor CA, and therefore detailed description thereof is not repeated.

Figure 10:
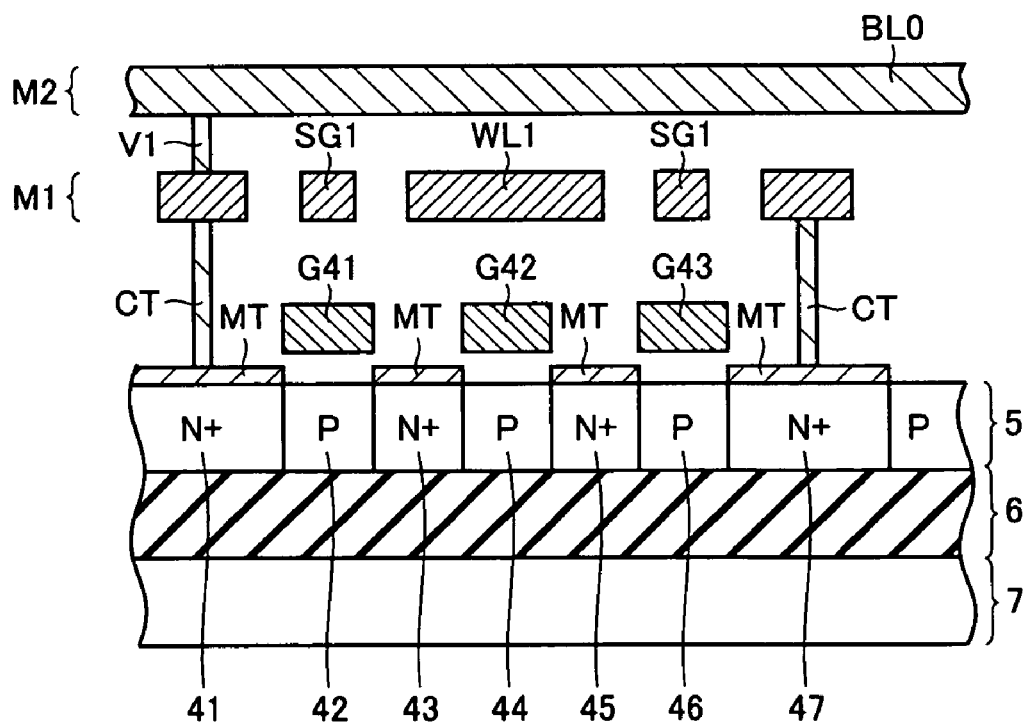
FIG. 10 is a cross-sectional view showing a cross section along X-X in FIG. 6.

FIG. 10 is a cross-sectional view showing a cross section along X-X in FIG. 6.

Referring to FIG. 10, N channel MOS transistor TR1A includes an N+ type semiconductor region 43 corresponding to drain, a P type semiconductor region 44 corresponding to body, an N+ type semiconductor region 45 corresponding to source, and a gate electrode G42. N channel MOS transistor TR2A includes an N+ type semiconductor region 41 corresponding to drain, a P type semiconductor region 42 corresponding to body, N+ type semiconductor region 43 corresponding to source, and a gate electrode G41. N channel MOS transistor TR3A includes N+ type semiconductor region 45 corresponding to drain, a P type semiconductor region 46 corresponding to body, an N+ type semiconductor region 47 corresponding to source, and a gate electrode G43. N+ type semiconductor region 43 is shared by N channel MOS transistors TR1A and TR2A. N+ type semiconductor region 45 is shared by N channel MOS transistors TR1A and TR3A.

N+ type semiconductor region 41 is connected, via contact CT, an interconnection in metal interconnection layer M1 and via V1, to bit line BL0 in metal interconnection layer M2. N+ type semiconductor region 47 is connected, via a contact and an interconnection in metal interconnection layer M1, to source line SL0 in metal interconnection layer M1.

Operation

Next, an operation when semiconductor device 101 according to the first embodiment of the present invention performs data writing is descried. In the following, memory cells MCA and MCB are representatively described.

Figure 11:
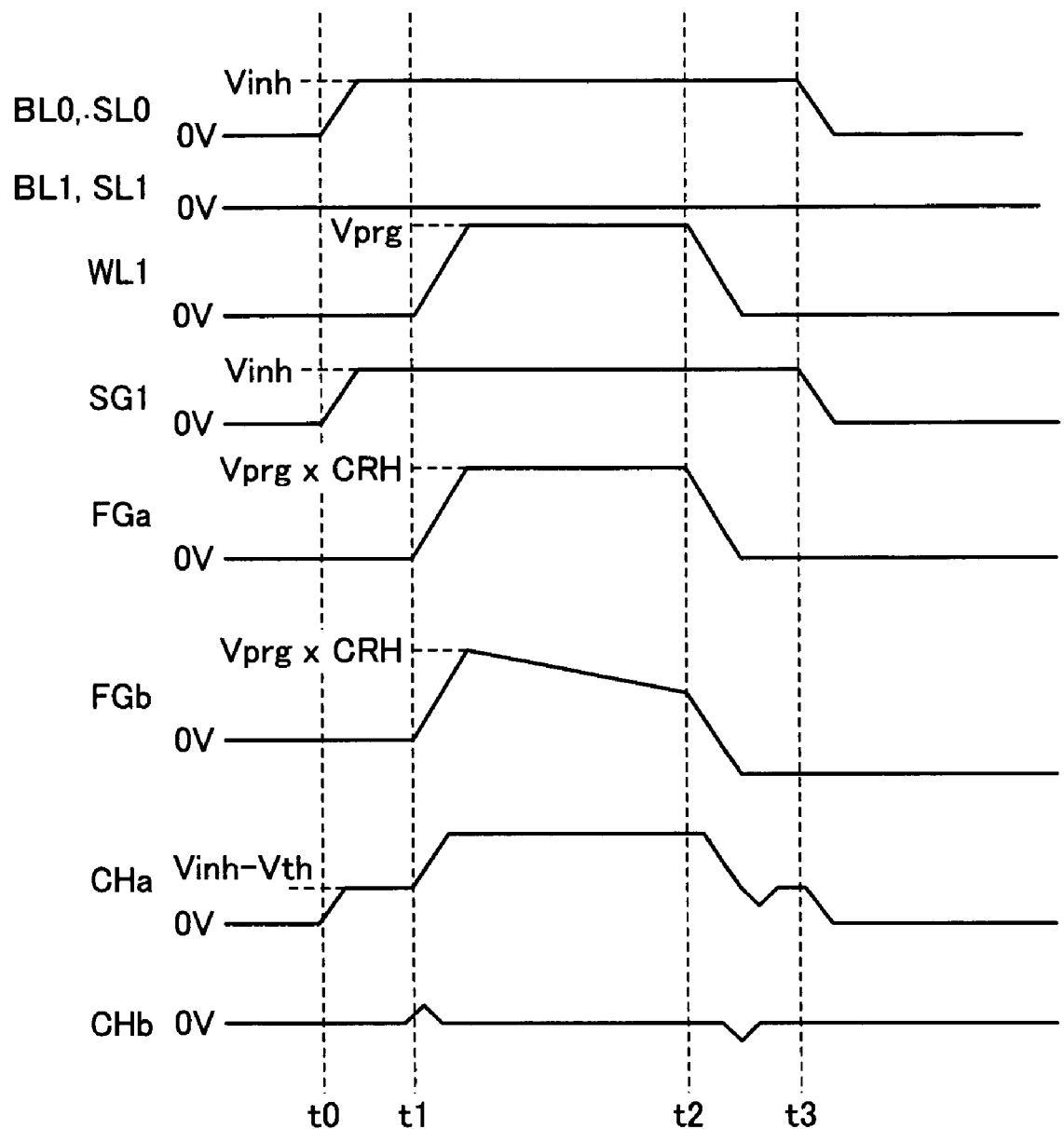
FIG. 11 is a voltage waveform diagram of each voltage control line showing an operation when semiconductor device 101 according to the first embodiment of the present invention performs data writing.

FIG. 11 is a voltage waveform diagram of each voltage control line showing an operation when semiconductor device 101 according to the first embodiment of the present invention performs data writing. Here, description is given as to a case where memory cell MCB is the target of data writing while memory cell MCA is not.

Referring to FIG. 11, in an initial state, a potential of each of bit lines BL0, BL1, source lines SL0, SL1, word line WL1, select gate line SG1, floating nodes FGa, FGb, channel nodes CHa, CHb is 0V, for example. Here, a channel node is a node in the channel region of N channel MOS transistor TR1. For example, a connection point of N channel MOS transistor TR1A and N channel MOS transistor TR2A in memory cell MCA corresponds to the channel node.

At time point t0, a write inhibit voltage Vinh is applied to bit line BL0 and source line SL0 corresponding to memory cell MCA. Also, at time point t0, write inhibit voltage Vinh is applied to select gate line SG1. Then, the potential of channel node CHa becomes Vinh−Vth. Here, Vth is the threshold voltage of N channel MOS transistor TR2A. A potential of each of bit line BL1 and source line SL1 corresponding to memory cell MCB being the data writing target is fixed at 0V. The timing where write inhibit voltage Vinh is applied may be different between bit line BL0/source line SL0 and select gate line SG1.

At time point t1, program voltage Vprg is applied to word line WL1. Then, by the coupling of MOS capacitors CA and CB, a potential of each of floating nodes FGa, FGb rises. Assuming that coupling ratio is CRH, a potential of each of floating nodes FGa, FGb rises to Vprg×CRH. Coupling ratio CRH is determined by the ratio between the capacitance of MOS capacitor C and the capacitance across the gate electrode and the body region of N channel MOS transistor TR1.

Here, since write inhibit voltage Vinh is applied to bit line BL0 and source line SL0, N channel MOS transistors TR2A, TR3A are in an off state. Then, the body region of N channel MOS transistor TR1A is in a floating state. Therefore, when the potential of floating node FGa rises in memory cell MCA, by the gate coupling of N channel MOS transistor TR1A, the potential of channel node CHa rises. Accordingly, the FN tunneling phenomenon via the gate oxide film of N channel MOS transistor TR1A does not occur in memory cell MCA.

In memory cell MCA, when program voltage Vprg is applied to word line WL1, the channel potential of N channel MOS transistor TR2A in memory cell MCA rises. Since the body region of N channel MOS transistor TR1A is in a floating state as described above, the potential of the body region of N channel MOS transistor TR1A also rises.

Here, in memory cell MCA, write inhibit voltage Vinh is applied to both source line SL0 and bit line BL0. Accordingly, the potential of the body region and the channel potential of N channel MOS transistor TR1A will not become lower than write inhibit voltage Vinh. Accordingly, it is necessary to set write inhibit voltage Vinh to a level with which erroneous writing due to FN tunneling does not occur even when the voltage of Vpgr×CRH−Vinh is applied to the gate oxide film of N channel MOS transistor TR1A.

On the other hand, in memory cell MCB, since a potential of each of bit line BL1 and source line SL1 is at 0V, channel node CHb is fixed at 0V. Accordingly, to the gate oxide film of N channel MOS transistor TR1B, a voltage of Vpgr×CRH is applied. Here, when program voltage Vprg is sufficiently great and coupling ratio CRH is great, the FN tunneling phenomenon occurs in the gate oxide film of N channel MOS transistor TR1B, and electrons are injected from channel node CHb into floating node FGb. By the injection of the electrons, the potential of floating node FGb becomes low. As a result, the threshold voltage of memory cell MCB relative to word line WL1 rises.

Next, at time point t2, applying of program voltage Vprg to word line WL1 is stopped, and the potential of word line WL1 becomes 0V. Then, the potential of floating node FGa becomes 0V, and the potential of floating node FGb becomes a negative potential. Alternatively, the potential of floating node FGb becomes lower than the potential of floating node FGa. As a result, the potential of channel node CHa becomes Vinh−Vth.

Next, at time point t3, applying of write inhibit voltage Vinh to bit line BL0, source line SL0 and select gate line SG1 is stopped, and a potential of each of bit line BL0, source line SL0 and select gate line SG1 becomes 0V. Then, the potential of channel node CHa becomes 0V.

Figure 12:
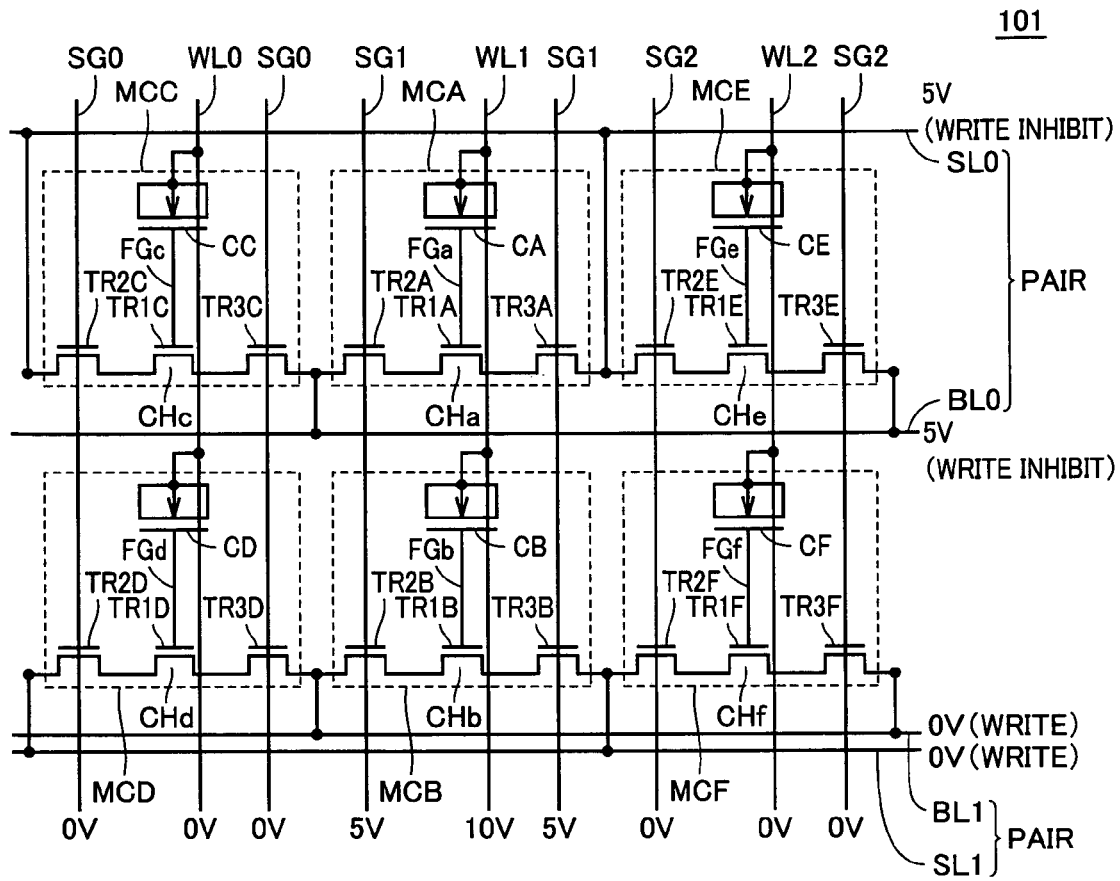
FIG. 12 shows an example of a program pulse voltage applied to each voltage control line when semiconductor device 101 according to the first embodiment of the present invention performs data writing.

FIG. 12 shows an example of a program pulse voltage applied to each voltage control line when semiconductor device 101 according to the first embodiment of the present invention performs data writing.

Referring to FIG. 12, write inhibit voltage Vinh of 5V is applied to bit line BL0 and source line SL0. Write inhibit voltage Vinh of 5V is applied to select gate line SG1. Program voltage Vprg of 10V is applied to word line WL1. A potential of each of bit line BL1, source line SL1, word lines WL0, WL2, select gate lines SG0, SG2 is fixed at 0V.

In memory cell MCA being not the target of data writing, the maximum voltage that may possibly be applied to the gate oxide film of N channel MOS transistor TR1A is Vprg×CRH−Vinh, i.e., 10V×1−5V=5V. N channel MOS transistor TR1A is designed to attain the potential relationship where erroneous writing does not occur, that is, where the FN tunneling reduction does not occur, even when 5V is applied to the gate oxide film.

Figure 13:
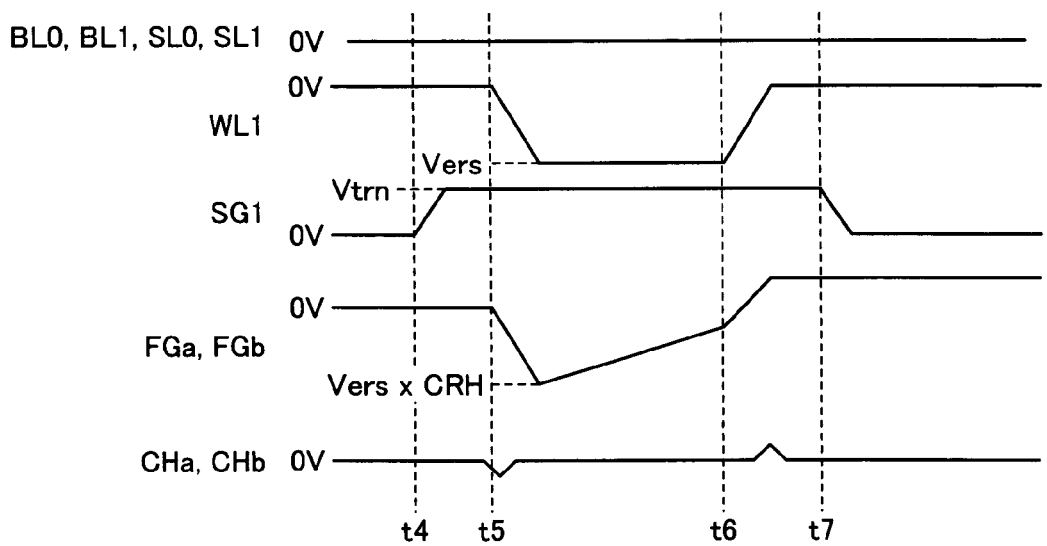
FIG. 13 is a voltage waveform diagram of each voltage control line showing an operation when semiconductor device 101 according to the first embodiment of the present invention performs data erasing.

FIG. 13 is a voltage waveform diagram of each voltage control line showing an operation when semiconductor device 101 according to the first embodiment of the present invention performs data erasing. Here, description will be given as to a case where memory cells MCA and MCB connected to word line WL1 are the targets of data erasing.

Referring to FIG. 13, memory cells MCA and MCB are erased together. In an initial state, a potential of each of bit lines BL0, BL1, source lines SL0, SL1, word line WL1, select gate line SG1, floating nodes FGa, FGb, channel nodes CHa, CHb is 0V, for example.

At time point t4, a potential of each of bit line BL0 and source line SL0 corresponding to memory cell MCA, and a potential of each of bit line BL1 and source line SL1 corresponding to memory cell MCB are fixed at 0V. At time point t4, voltage Vtrn is applied to select gate line SG1. Then, N channel MOS transistors TR2A, TR3A, TR2B, TR3B enter an on state, and 0V potential of each of bit lines BL0, BL1, source lines SL0, SL1 is transmitted to source and drain of N channel MOS transistors TR1A, TR1B.

Next, at time point t5, negative erasure voltage Vers is applied to word line WL1. Then, a potential of each of floating nodes FGa, FGb drops to Vers×CRH. Here, since source and drain of C channel MOS transistors TR1A, TR1B are fixed at 0V, the FN tunneling phenomenon occurs across gate-drain and gate-source of N channel MOS transistors TR1A, TR1B, and electrons in floating gates FGa, FGb are drawn. By the drawing of electrons, the potential of each of floating gates FGa, FGb rises. As a result, the threshold voltage of memory cells MCA, MCB becomes low.

Next, at time point t6, applying of erasure voltage Vers to word line WL1 is stopped, and the potential of word line WL1 becomes 0V. Then, corresponding to the amount of the electrons drawn by the FN tunneling phenomenon, the potential of each of floating nodes FGa, FGb rises.

Next, at time point t7, applying of voltage Vtrn to select gate line SG1 is stopped, and the potential of select gate line SG1 becomes 0V.

Figure 14:
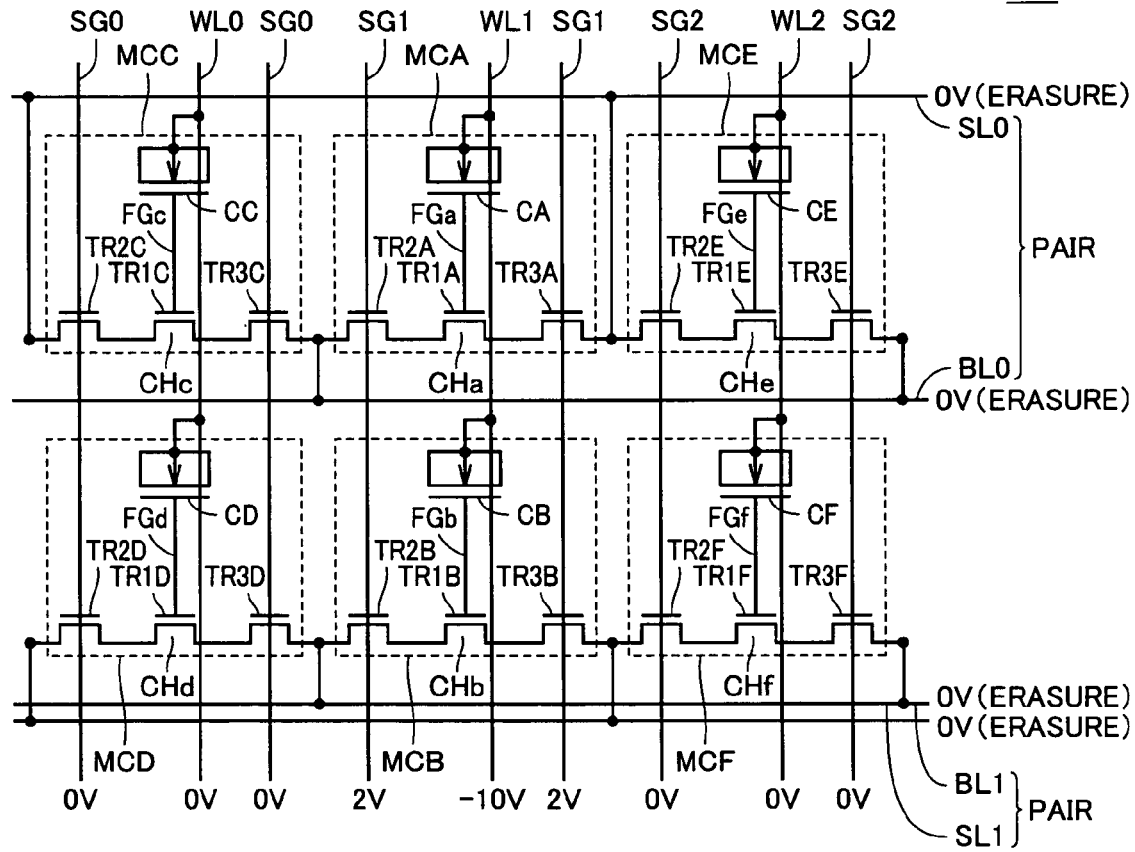
FIG. 14 shows an example of an erasure pulse voltage applied to each voltage control line when semiconductor device 101 according to the first embodiment of the present invention performs data erasing.

FIG. 14 shows an example of an erasure pulse voltage applied to each voltage control line when semiconductor device 101 according to the first embodiment of the present invention performs data erasing.

Referring to FIG. 14, voltage Vtrn of 2V is applied to select gate line SG1. Erasure voltage Vers of −10V is applied to word line WL1. A potential of each of bit lines BL0, BL1, source lines SL0, SL1, word lines WL0, WL2, and select gate lines SG0, SG2 is fixed at 0V.

Figure 15:
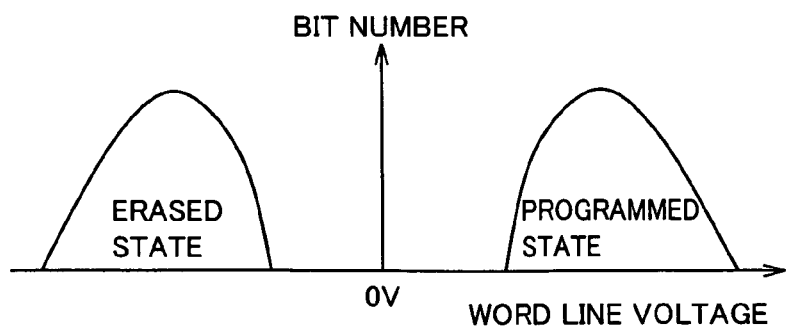
FIG. 15 shows threshold voltage distribution of a memory cell in semiconductor device 101 according to the first embodiment of the present invention.

FIG. 15 shows threshold voltage distribution of a memory cell in semiconductor device 101 according to the first embodiment of the present invention.

Referring to FIG. 15, in semiconductor device 101 according to the first embodiment of the present invention, a state where the threshold voltage of memory cell MC relative to word line WL becomes high is a written state (programmed state), and a state where threshold voltage becomes low is an erased state.

Here, provided that the potential of word line WL in data reading is maintained at 0V, relative to 0V that is the potential of word line WL, a current passes through memory cell MC if the threshold voltage of memory cell MC is negative, while a current does not pass through memory cell MC if the threshold voltage is positive. Thus, whether the stored data of memory cell MC is "0" or "1" can be determined.

Figure 16:
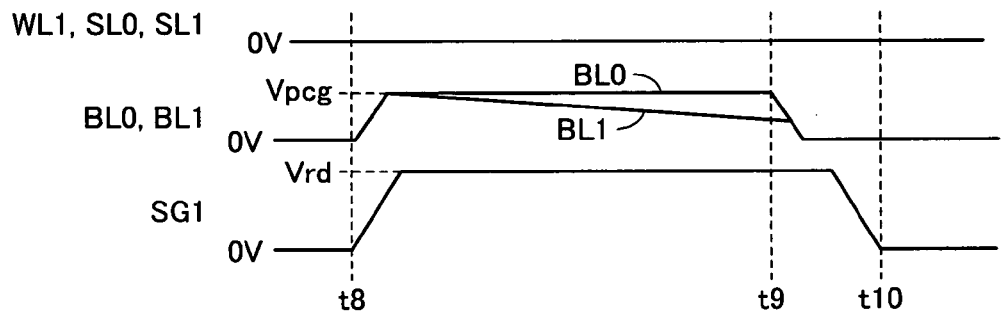
FIG. 16 is a voltage waveform diagram of each voltage control line showing an operation when semiconductor device 101 according to the first embodiment of the present invention performs data reading.

FIG. 16 is a voltage waveform diagram of each voltage control line showing an operation when semiconductor device 101 according to the first embodiment of the present invention performs data reading. Here, description will be given as to a case where memory cells MCA and MCB are the data reading targets.

Referring to FIG. 16, in an initial state, a potential of each of bit lines BL0, BL1, source lines SL0, SL1, word line WL1, and select gate line SG1 is 0V, for example.

At time point t8, bit lines BL0, BL1 are precharged and each potential rises to precharge voltage Vpcg. Also, voltage Vrd is applied to select gate line SG1. Then, N channel MOS transistors TR2A, TR3A, TR2B, TR3B enter an on state.

Here, it is assumed that memory cell MCA is in a programmed state, i.e., a written state, while memory cell MCB is in an erased state. In memory cell MCA, since the threshold voltage is greater than the voltage of word line WL1, N channel MOS transistor TR1A is in an off state. Accordingly, a current does not flow between bit line BL0 and source line SL0, whereby from time point t8 to time point t9, the potential of bit line BL0 does not become low but remains at precharge voltage Vpcg. On the other hand, in memory cell MCB, since the threshold voltage is smaller than the voltage of word line WL1, N channel MOS transistor TR1B is in an on state. Accordingly, a current passes between bit line BL1 and source line SL1, whereby the potential of bit line BL1 becomes smaller than precharge voltage Vpcg. Accordingly, by determining a potential of each of bit lines BL0 and BL1 at time point t9, the storage data of memory cells MCA and MCB can be read.

Next, from time point t9 to time point t10, bit lines BL0, BL1 are discharged and each potential becomes 0V. Then, applying of voltage Vrd to select gate line SG1 is stopped, and potential of select gate line SG1 becomes 0V.

Meanwhile, in a configuration where a bulk substrate is used such as in the nonvolatile memory cell disclosed by Non-Patent Document 1, it is necessary to insulation-isolate N type wells on which three elements are formed by STI, and to separately control the applied voltages to the N type wells. Therefore, there has been a problem that the cell size is increased and the large capacity cannot be attained. On the other hand, in semiconductor device 101 according to the first embodiment of the present invention, in memory cell MC, a plurality of N channel MOS transistors TR and MOS capacitor C have the SOI structure. That is, since the substrate for each element is insulation-isolated in the SOI structure, it is not necessary to additionally insulation-isolate the substrate for each element. Thus, the substrate potential of each element can independently be controlled without increasing the cell size.

Furthermore, since memory cell MC does not have a floating gate in semiconductor apparatus 101 according to the first embodiment of the present invention, it is not necessary to add a process step of forming a floating gate to normal CMOS process steps.

Accordingly, semiconductor apparatus 101 according to the first embodiment of the present invention is capable of storing data in a nonvolatile manner, preventing an increase in the number of process steps, and being small in size.

The P type body region of MOS capacitor C has its potential fixed. That is, the P type body region is connected to a word line via a P+ type semiconductor region. With such a configuration, it is not necessary to implement a capacitor having both features of accumulation type and an inversion type by a method of isolating the substrates of respective elements each having the MOS structure, and therefore MOS capacitor C can be formed with a small area.

In semiconductor device 101 according to the first embodiment of the present invention, N channel MOS transistor TR has the complete isolated type SOI structure. Accordingly, the P type body region of N channel MOS transistor TR is in a floating state.

Here, if the source potential of N channel MOS transistor TR3 in memory cell MC being not the data writing target is at 0V, even when N channel MOS transistor TR3 is in an off state, a current flows from bit line BL to source line SL by the potential fluctuation of the P type body region of N channel MOS transistor TR3, and the write inhibit voltage applied to bit line BL may become low.

However, semiconductor device 101 according to the first embodiment of the present invention has a plurality of source lines SL arranged corresponding to the rows of memory cell MC. That is, source line SL is arranged for each bit line BL; a write inhibit voltage is applied to source line SL corresponding to memory cell MC being not the data write target; and 0V is applied to source line SL corresponding to memory cell MC being the data write target. With such a configuration, in memory cell MC being not the data write target, the write inhibit voltage applied to bit line BL can be prevented from becoming low, and erroneous writing of data can be prevented.

Next, referring to the drawings, another embodiment of the present invention is described. In the drawings, the same or corresponding parts are denoted by the same reference character, and description thereof is not repeated.

Second Embodiment

Configuration and Basic Operation

The present embodiment relates to a semiconductor device that is different from the semiconductor device of the first embodiment in that a source line is not arranged for each bit line, but is shared. The present embodiment is the same as the semiconductor device of the first embodiment except for the features described in the following.

Figure 17A:
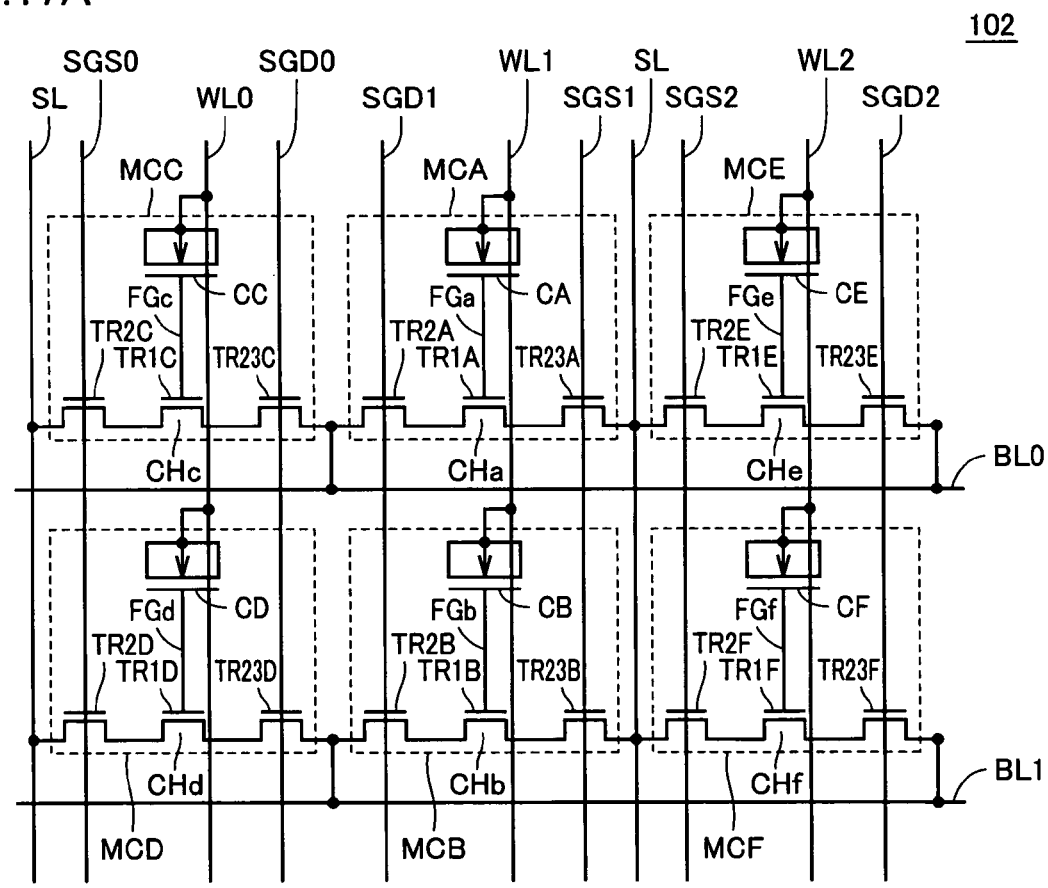
FIG. 17A is a circuit diagram showing a configuration of a semiconductor device 102 according to a second embodiment of the present invention.
Figure 17B:
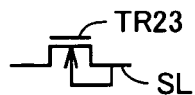
FIG. 17B shows a configuration of an N channel MOS transistor TR23.

FIG. 17A is a circuit diagram showing a configuration of a semiconductor device 102 according to a second embodiment of the present invention. FIG. 17B shows a configuration of an N channel MOS transistor TR23. In the following, the extending direction of bit lines BL is referred to as the row direction, and the extending direction of word lines WL is referred to as the column direction.

Referring to FIG. 17A, semiconductor device 102 includes: a plurality of memory cells arranged in rows and columns; a plurality of bit lines BL arranged corresponding to the rows of the memory cell; and a plurality of word lines WL, a plurality of source lines SL, a plurality of select gate lines SGD, and a plurality of select gate lines SGS arranged corresponding to the columns of the memory cell. In FIG. 17A, memory cells MCA, MCB, MCC, MCD, MCE, MCF, bit lines BL0, BL1, word lines WL0, WL1, WL2, select gate lines SGD0, SGD1, SGD2, and select gate lines SGS0, SGS1, SGS2 are representatively shown. In the following, a plurality of memory cells may also be generally referred to as memory cell MC, and a plurality of bit lines, word lines, and select gate lines may also be generally referred to as bit line BL, word line WL, select gate line SGD, and select gate line SGS, respectively.

Memory cell MCA includes an MOS capacitor CA and N channel MOS transistors (insulated gate type field-effect transistors) TR1A, TR2A, TR23A. Memory cell MCB includes an MOS capacitor CB and N channel MOS transistors (insulated gate type field-effect transistors) TR1B, TR2B, TR23B. Memory cell MCC includes an MOS capacitor CC and N channel MOS transistors (insulated gate type field-effect transistors) TR1C, TR2C, TR23C. Memory cell MCD includes an MOS capacitor CD and N channel MOS transistors (insulated gate type field-effect transistors) TR1D, TR2D, TR23D. Memory cell MCE includes an MOS capacitor CE and N channel MOS transistors (insulated gate type field-effect transistors) TR1E, TR2E, TR23E. Memory cell MCF includes an MOS capacitor CF and N channel MOS transistors (insulated gate type field-effect transistors) TR1F, TR2F, TR23F.

In the following, MOS capacitors CA, CB, CC, CD, CE, CF may be generally referred to as MOS capacitor C. N channel MOS transistors TR1A, TR1B, TR1C, TR1D, TR1E, TR1F may be referred to as N channel MOS transistor TR1. N channel MOS transistors TR2A, TR2B, TR2C, TR2D, TR2E, TR2F may be referred to as N channel MOS transistor TR2. N channel MOS transistors TR23A, TR23B, TR23C, TR23D, TR23E, TR23F may be referred to as N channel MOS transistor TR23. N channel MOS transistors TR1, TR2, TR23 may generally be referred to as N channel MOS transistor TR.

In memory cell MCA, MOS capacitor CA has its gate electrode connected to the gate electrode of N channel MOS transistor TR1A, and has its drain, source and body connected to word line WL1. N channel MOS transistor TR1A has its drain connected to source of N channel MOS transistor TR2A, and has its source connected to drain of N channel MOS transistor TR23A. N channel MOS transistor TR2A has its drain connected to bit line BL0, and has its gate connected to select gate line SGD1. N channel MOS transistor TR23A has its source connected to source line SL0, and has its gate connected to select gate line SGS1. A connection point of the gate electrode of MOS capacitor CA and the gate electrode of N channel MOS transistor TR1A is a floating node FGa corresponding to a floating gate.

In memory cell MCB, MOS capacitor CB has its gate electrode connected to the gate electrode of N channel MOS transistor TR1B, and has its drain, source and body connected to word line WL1. N channel MOS transistor TR1B has its drain connected to source of N channel MOS transistor TR2B, and has its source connected to drain of N channel MOS transistor TR23B. N channel MOS transistor TR2B has its drain connected to bit line BL1, and has its gate connected to select gate line SGD1. N channel MOS transistor TR23B has its source connected to source line SL1, and has its gate connected to select gate line SGS1. A connection point of the gate electrode of MOS capacitor CB and the gate electrode of N channel MOS transistor TR1B is a floating node FGb corresponding to a floating gate.

The connection configuration of memory cell MCC is similar to memory cell MCA except that word line WL1 is replaced by word line WL0 and select gate lines SGD1, SGS1 are replaced by select gate lines SGD0, SGS0. The connection configuration of memory cell MCE is similar to memory cell MCA except that word line WL1 is replaced by word line WL2 and select gate lines SGD1, SGS1 are replaced by select gate lines SGD2, SGS2. The connection configuration of memory cell MCD is similar to memory cell MCB except that word line WL1 is replaced by word line WL0 and select gate lines SGD1, SGS1 are replaced by select gate lines SGD0, SGS0. The connection configuration of memory cell MCF is similar to memory cell MCB except that word line WL1 is replaced by word line WL2 and select gate lines SGD1, SGS1 are replaced by select gate lines SGD2, SGS2. In the following, floating nodes FGa, FGb, FGc, FGd, FGe, FGf may generally be referred to as floating node FG.

Referring to FIG. 17B, N channel MOS transistor TR23 has its body electrically connected to source of N channel MOS transistor TR23. That is, N channel MOS transistors TR23A, TR23B, TR23C, TR23D, TR23E, TR23F, have respective bodies electrically connected to source line SL.

Figure 18:
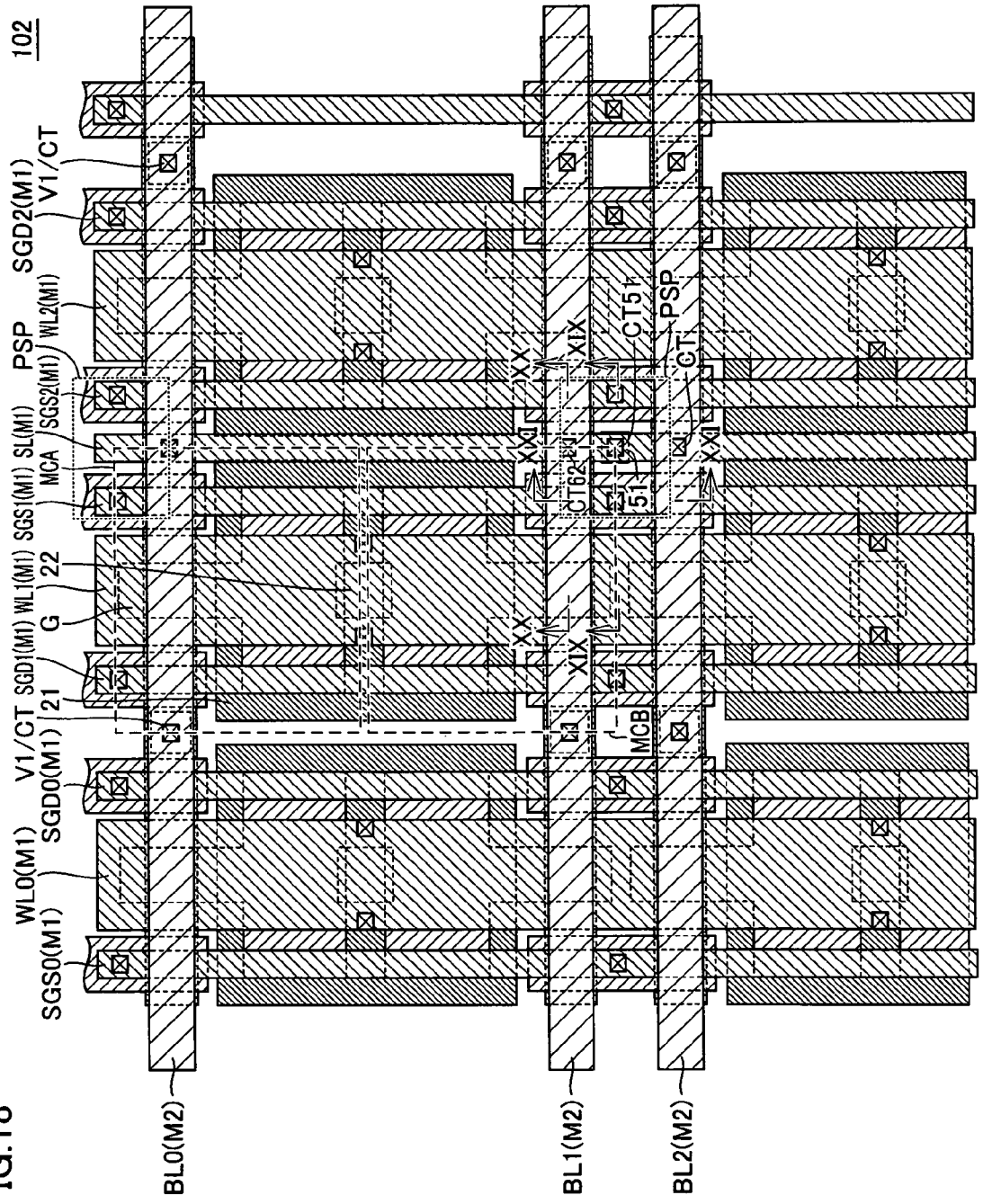
FIG. 18 schematically shows a layout of semiconductor device 102 according to the second embodiment of the present invention.

FIG. 18 schematically shows a layout of semiconductor device 102 according to the second embodiment of the present invention. In FIG. 18, regions corresponding to memory cells MCA and MCB are representatively enclosed by dashed lines, respectively.

Referring to FIG. 18, bit lines BL0, BL1, BL2 are provided in metal interconnection layer M2 in the row direction. Word lines WL0, WL1, WL2, source line SL and select gate lines SGD0, SGD1, SGD2 SGS0, SGS1, SGS2 are provided in metal interconnection layer M1, positioned lower than metal interconnection layer M2, in the column direction. Word lines WL0, WL1, WL2, source line SL and select gate lines SGD0, SGD1, SGD2, SGS0, SGS1, SGS2 are arranged substantially perpendicularly to bit lines BL0, BL1, BL2.

In memory cell MCA, N channel MOS transistor TR1A is arranged corresponding to the intersection of bit line BL0 and word line WL1. N channel MOS transistors TR2A and TR23A are arranged on both sides of N channel MOS transistor TR1A along bit line BL0. N channel MOS transistor TR1A and capacitor CA are arranged along word line WL1.

In memory cell MCB, N channel MOS transistor TR1B is arranged corresponding to the intersection of bit line BL1 and word line WL1. N channel MOS transistors TR2B and TR23B are arranged on both sides of N channel MOS transistor TR1B along bit line BL1. N channel MOS transistor TR1B and capacitor CB are arranged along word line WL1.

A partial isolation region PSP for electrically connecting the body region and source region of N channel MOS transistor TR23 is arranged corresponding to the intersection of source line SL and bit line BL. Partial isolation region PSP is shared by four memory cells MC arranged in two rows and two columns.

Figure 19:
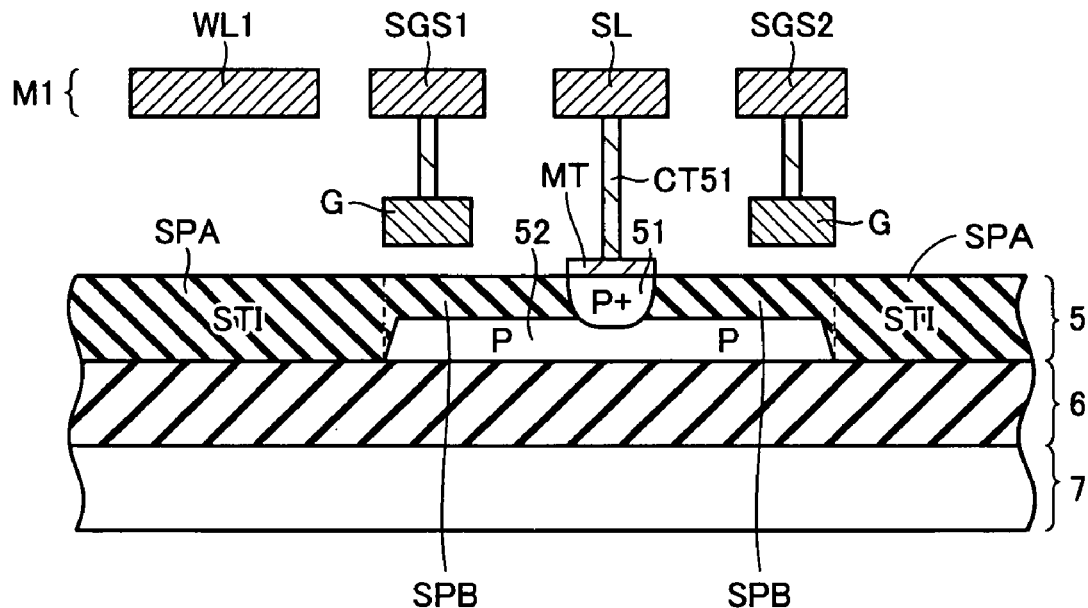
FIG. 19 is a cross-sectional view showing a cross section along XIX-XIX in FIG. 18.
Figure 20:
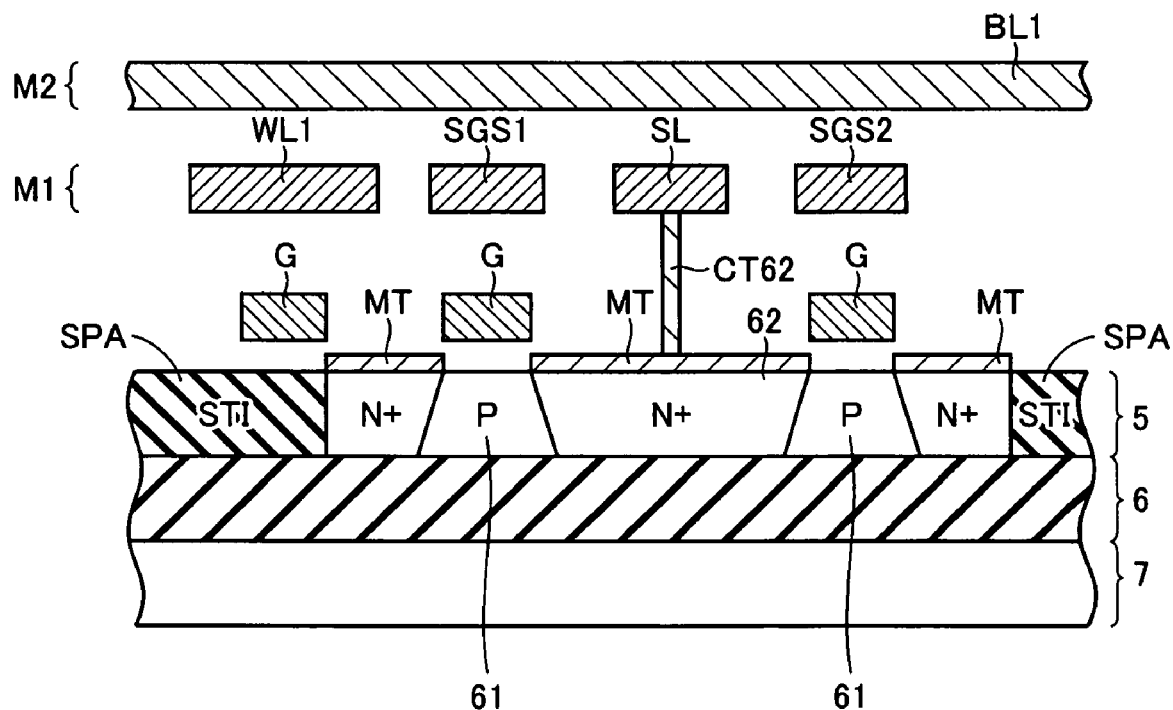
FIG. 20 is a cross-sectional view showing a cross section along XX-XX in FIG. 18.
Figure 21:
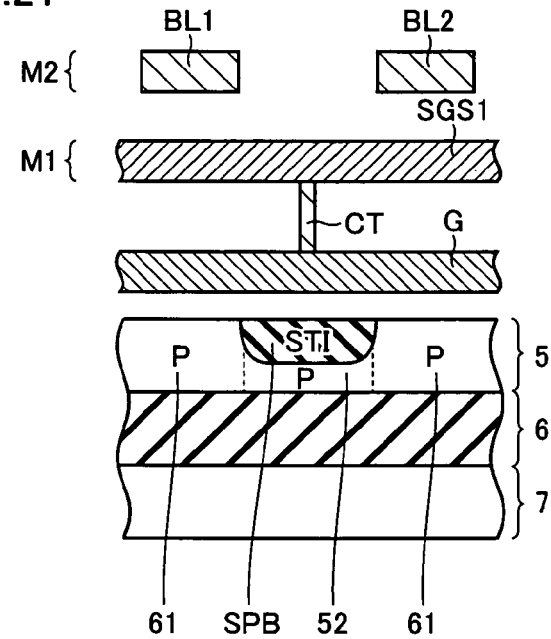
FIG. 21 is a cross-sectional view showing a cross section along XXI-XXI in FIG. 18.

FIG. 19 is a cross-sectional view showing a cross section along XIX-XIX in FIG. 18. FIG. 20 is a cross-sectional view showing a cross section along XX-XX in FIG. 18. FIG. 21 is a cross-sectional view showing a cross section along XXI-XXI in FIG. 18.

Referring to FIGS. 19-21, semiconductor device 102 includes a P+ type semiconductor region 51, a P type semiconductor region 52, a P type semiconductor region 61, an N+ type semiconductor region 62, an STI region SPA, and an STI region SPB. P type semiconductor region 61 corresponds to the body region of N channel MOS transistor TR23. N+ type semiconductor region 62 corresponds to the drain or source region of N channel MOS transistor TR23.

STI region SPA is formed in active layer 5, and isolates active regions corresponding to respective elements. STI region SPB is formed on the surface of active layer 5, with a gap between oxide film 6.

P type semiconductor region 52 is adjacent to P type body region 61 of N channel MOS transistor TR23, and formed to include a region between STI region SPB and oxide film 6. P type semiconductor region 52 has the conductivity type identical to P type body region 61 of N channel MOS transistor TR23. P+ type semiconductor region 51 is formed on the surface of active layer 5 and on P type semiconductor region 52.

Semiconductor device 102 further includes a contact CT51 connecting P+ type semiconductor region 51 in partial isolation region PSP and source line SL, and a contact CT62 connecting N+ type semiconductor region 62 of N channel MOS transistor TR23 and source line SL. That is, P type body region 61 of N channel MOS transistor TR23 is electrically connected to N+ type semiconductor region 62 of N channel MOS transistor TR23 via P type semiconductor region 52, P+ type semiconductor region 51 and source line SL.

Operation

Next, an operation when semiconductor device 102 according to the second embodiment of the present invention performs data writing is descried. In the following, memory cells MCA and MCB are representatively described.

Figure 22:
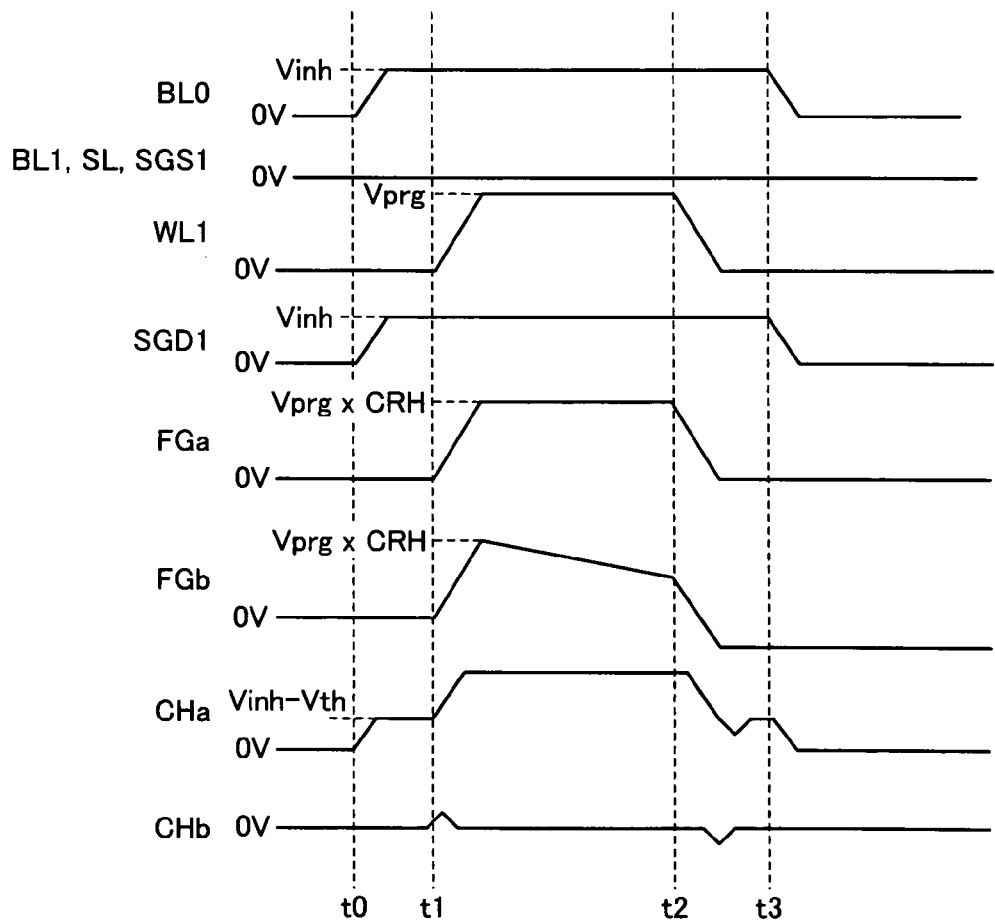
FIG. 22 is a voltage waveform diagram of each voltage control line showing an operation when semiconductor device 102 according to the second embodiment of the present invention performs data writing.

FIG. 22 is a voltage waveform diagram of each voltage control line showing an operation when semiconductor device 102 according to the second embodiment of the present invention performs data writing. Here, description is given as to a case where memory cell MCB is the target of data writing while memory cell MCA is not.

Referring to FIG. 22, in an initial state, a potential of each of bit lines BL0, BL1, source line SL word line WL1, select gate lines SGD1, SGS1, floating nodes FGa, FGb, channel nodes CHa, CHb is 0V, for example. Here, a channel node is a node in the channel region of N channel MOS transistor TR1. For example, a connection point of N channel MOS transistor TR1A and N channel MOS transistor TR2A in memory cell MCA corresponds to the channel node.

At time point t0, write inhibit voltage Vinh is applied to bit line BL0 corresponding to memory cell MCA. Also, at time point t0, write inhibit voltage Vinh is applied to select gate line SGD1. Then, the potential of channel node CHa becomes Vinh-Vth. Here, Vth is the threshold voltage of N channel MOS transistor TR2A. The potential of bit line BL1 corresponding to memory cell MCB being the data writing target is fixed at 0V. The timing where write inhibit voltage Vinh is applied may be different between bit line BL0 and select gate line SGD1.

At time point t1, program voltage Vprg is applied to word line WL1. Then, by the coupling of MOS capacitors CA and CB, a potential of each of floating nodes FGa, FGb rises. Assuming that coupling ratio is CRH, a potential of each of floating nodes FGa, FGb rises to Vprg×CRH. Coupling ratio CRH is determined by the ratio between the capacitance of MOS capacitor C and the capacitance across the gate electrode and the body region of N channel MOS transistor TR1.

Here, since write inhibit voltage Vinh is applied to bit line BL0, N channel MOS transistor TR2A is in an off state. Additionally, since the potential of select gate line SGS1 is 0V, N channel MOS transistor TR23A is in an off state. Then, the body region of N channel MOS transistor TR1A is in a floating state. Therefore, when the potential of floating node FGa rises in memory cell MCA, by the gate coupling of N channel MOS transistor TR1A, the potential of channel node CHa rises. Accordingly, the FN tunneling phenomenon via the gate oxide film of N channel MOS transistor TR1A does not occur in memory cell MCA.

In memory cell MCA, when program voltage Vprg is applied to word line WL1, the channel potential of N channel MOS transistor TR2A in memory cell MCA rises. Since the body region of N channel MOS transistor TR1A is in the floating state as described above, the potential of the body region of N channel MOS transistor TR1A also rises.

Here, in memory cell MCA, the body of N channel MOS transistor TR23A is fixed at 0V being the potential of source line SL by partial isolation region PSP described above. Thus, N channel MOS transistor TR23A is in an off state, and therefore write inhibit voltage Vinh applied to bit line BL0 will not become low by the a current passing through N channel MOS transistor TR23A. While the body of N channel MOS transistor TR2A connected to bit line BL0 is in the floating state, since write inhibit voltage Vinh is applied to bit line BL0, the potential of the body region and the channel potential of N channel MOS transistor TR1A will not become lower than write inhibit voltage Vinh. Accordingly, it is necessary to set write inhibit voltage Vinh to a level with which erroneous writing due to FN tunneling does not occur even when the voltage of Vpgr×CRH−Vinh is applied to the gate oxide film of N channel MOS transistor TR1A.

On the other hand, in memory cell MCB, since a potential of each of bit line BL1 and source line SL1 is at 0V, channel node CHb is fixed at 0V. Accordingly, to the gate oxide film of N channel MOS transistor TR1B, a voltage of Vpgr×CRH is applied. Here, when program voltage Vprg is sufficiently great and coupling ratio CRH is great, the FN tunneling phenomenon occurs in the gate oxide film of N channel MOS transistor TR1B, and electrons are injected from channel node CHb into floating node FGb. By the injection of the electrons, the potential of floating node FGb becomes low. As a result, the threshold voltage of memory cell MCB relative to word line WL1 rises.

Next, at time point t2, applying of program voltage Vprg to word line WL1 is stopped, and the potential of word line WL1 becomes 0V. Then, the potential of floating node FGa becomes 0V, and the potential of floating node FGb becomes a negative potential. Alternatively, the potential of floating node FGb becomes lower than the potential of floating node FGa. As a result, the potential of channel node CHa becomes Vinh-Vth.

Next, at time point t3, applying of write inhibit voltage Vinh to bit line BL0 and select gate line SGD1 is stopped, and a potential of each of bit line BL0 and select gate line SGD1 becomes 0V. Then, the potential of channel node CHa becomes 0V.

Figure 23:
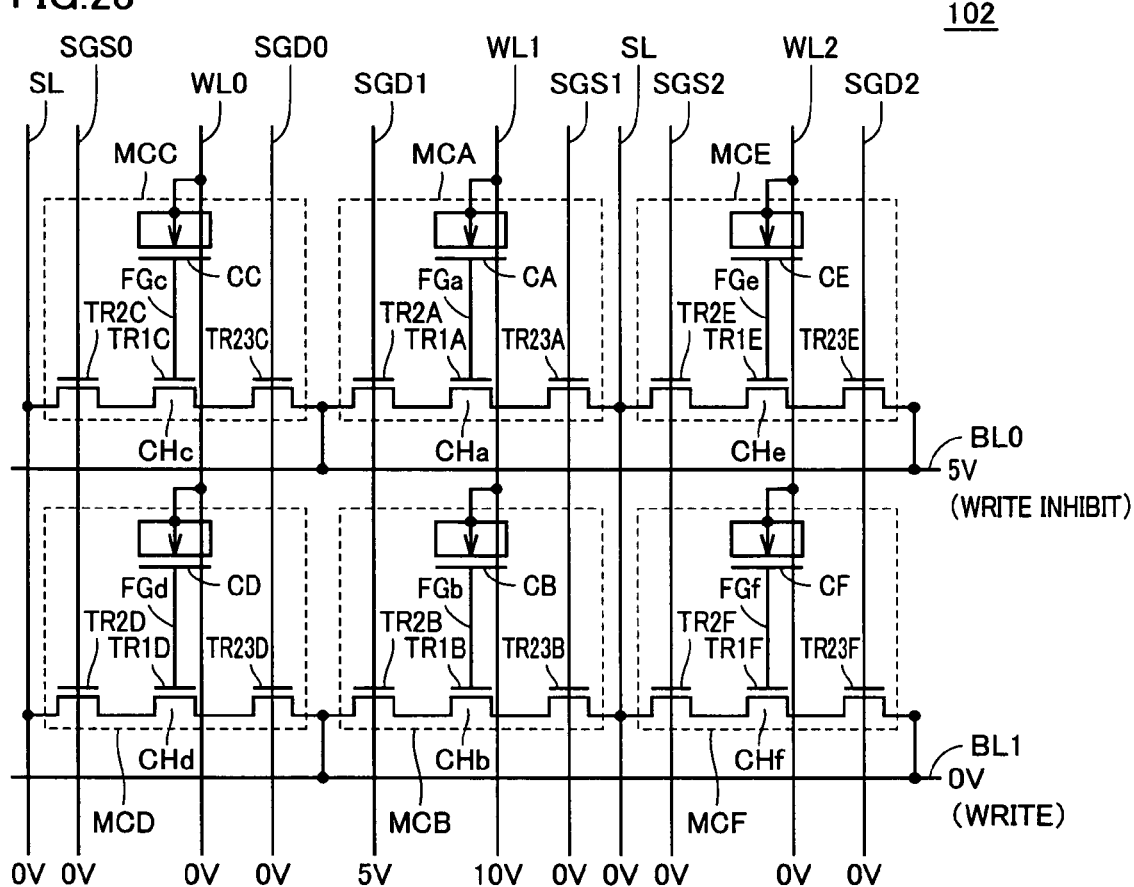
FIG. 23 shows an example of a program pulse voltage applied to each voltage control line when semiconductor device 102 according to the second embodiment of the present invention performs data writing.

FIG. 23 shows an example of a program pulse voltage applied to each voltage control line when semiconductor device 102 according to the second embodiment of the present invention performs data writing.

Referring to FIG. 23, write inhibit voltage Vinh of 5V is applied to bit line BL0. Write inhibit voltage Vinh of 5V is applied to select gate line SGD1. Program voltage Vprg of 10V is applied to word line WL1. A potential of each of bit line BL1, source line SL1, word lines WL0, WL2, select gate lines SGD0, SGD2, SGS0, SGS1, SGS2 is fixed at 0V.

In memory cell MCA being not the target of data writing, the maximum voltage that may possibly be applied to the gate oxide film of N channel MOS transistor TR1A is Vprg×CRH−Vinh, i.e., 10V×1−5V=5V. N channel MOS transistor TR1A is designed to attain the potential relationship where erroneous writing does not occur, that is, where the FN tunneling reduction does not occur, even when 5V is applied to the gate oxide film.

Figure 24:
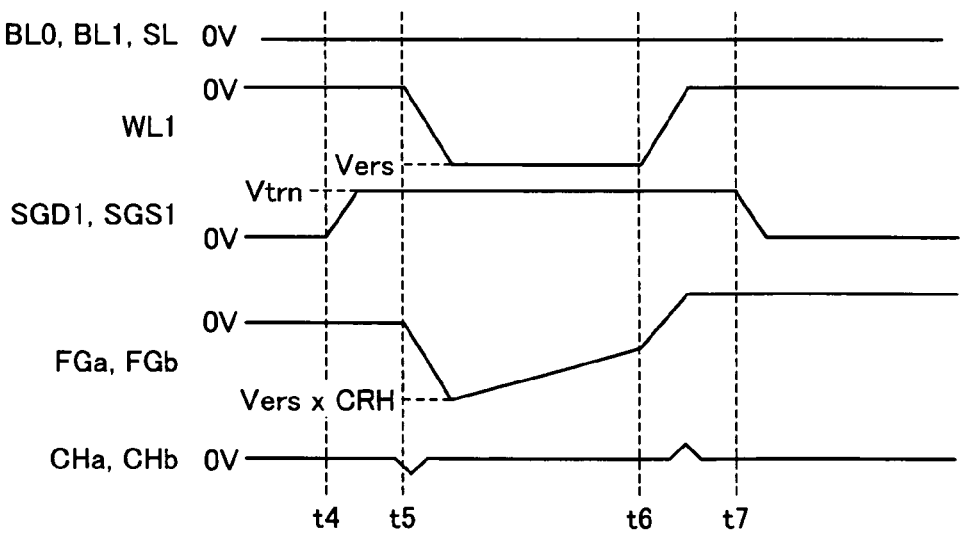
FIG. 24 is a voltage waveform diagram of each voltage control line showing an operation when semiconductor device 102 according to the second embodiment of the present invention performs data erasing.

FIG. 24 is a voltage waveform diagram of each voltage control line showing an operation when semiconductor device 102 according to the second embodiment of the present invention performs data erasing. Here, description will be given as to a case where memory cells MCA and MCB connected to word line WL1 are the targets of data erasing.

Referring to FIG. 24, memory cells MCA and MCB are erased together. In an initial state, a potential of each of bit lines BL0, BL1, source line SL, word line WL1, select gate lines SGD1, SGS1, floating nodes FGa, FGb, channel nodes CHa, CHb is 0V, for example.

At time point t4, a potential of bit line BL0 corresponding to memory cell MCA, and a potential of each of bit line BL1 and source line SL1 corresponding to memory cell MCB are fixed at 0V. At time point t4, voltage Vtrn is applied to select gate lines SGD1, SGS1. Then, N channel MOS transistors TR2A, TR23A, TR2B, TR23B enter an on state, and 0V potential of each of bit lines BL0, BL1, and source line SL is transmitted to source and drain of N channel MOS transistors TR1A, TR1B.

Next, at time point t5, negative erasure voltage Vers is applied to word line WL1. Then, a potential of each of floating nodes FGa, FGb drops to Vers×CRH. Here, since source and drain of C channel MOS transistors TR1A, TR1B are fixed at 0V, the FN tunneling phenomenon occurs across gate-drain and gate-source of N channel MOS transistors TR1A, TR1B, and electrons in floating gates FGa, FGb are drawn. By the drawing of electrons, the potential of each of floating gates FGa, FGb rises. As a result, the threshold voltage of memory cells MCA, MCB becomes low.

Next, at time point t6, applying of erasure voltage Vers to word line WL1 is stopped, and the potential of word line WL1 becomes 0V. Then, corresponding to the amount of the electrons drawn by the FN tunneling phenomenon, the potential of each of floating nodes FGa, FGb rises.

Next, at time point t7, applying of voltage Vtrn to select gate lines SGD1, SGS1 is stopped, and each potential of select gate lines SGD1, SGS1 becomes 0V.

Figure 25:
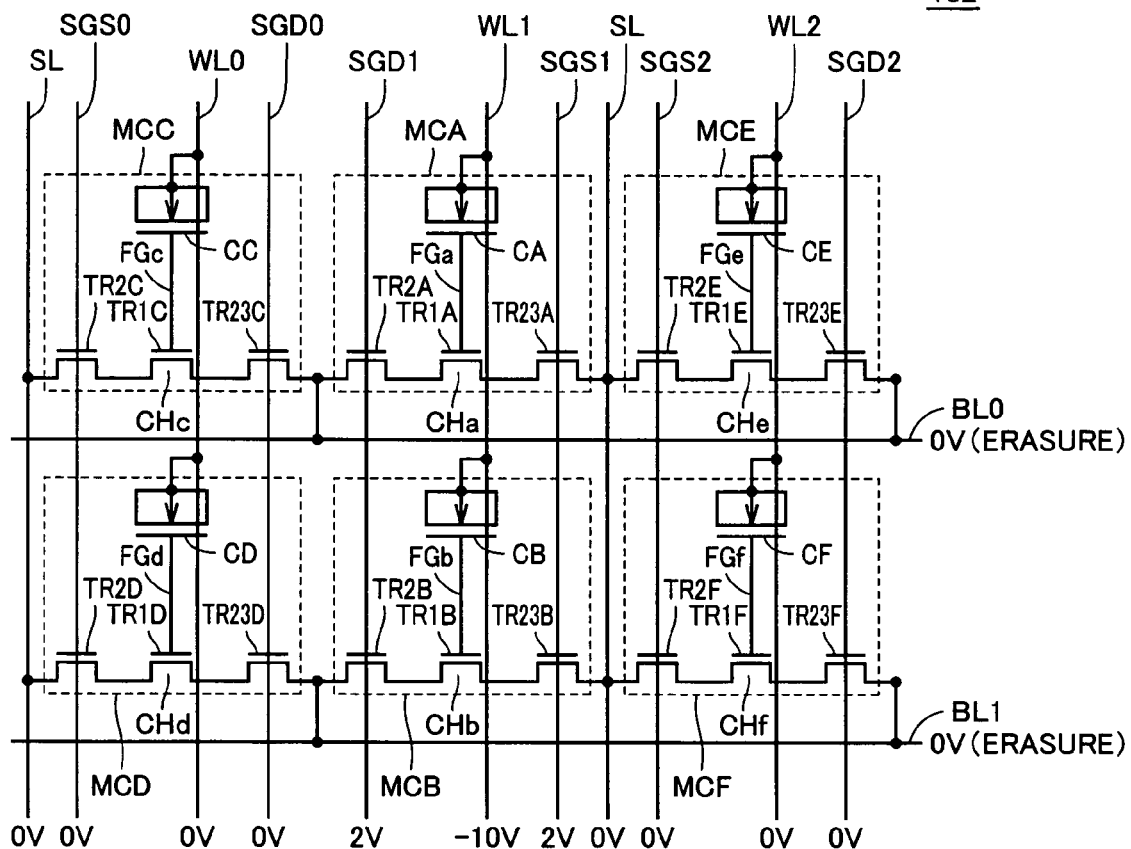
FIG. 25 shows an example of an erasure pulse voltage applied to each voltage control line when semiconductor device 102 according to the second embodiment of the present invention performs data erasing.

FIG. 25 shows an example of an erasure pulse voltage applied to each voltage control line when semiconductor device 102 according to the second embodiment of the present invention performs data erasing.

Referring to FIG. 25, voltage Vtrn of 2V is applied to select gate lines SGD1, SGS1. Erasure voltage Vers of −10V is applied to word line WL1. A potential of each of bit lines BL0, BL1, source line SL, word lines WL0, WL2, and select gate lines SGD0, SGD2, SGS0, SGS2 is fixed at 0V.

Figure 26:
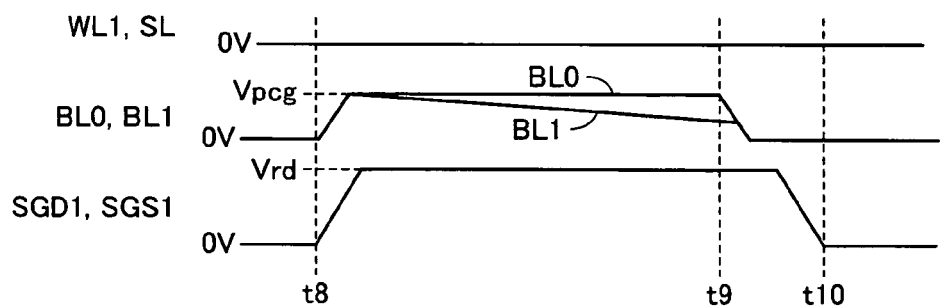
FIG. 26 is a voltage waveform diagram of each voltage control line showing an operation when semiconductor device 102 according to the second embodiment of the present invention performs data reading.

FIG. 26 is a voltage waveform diagram of each voltage control line showing an operation when semiconductor device 102 according to the second embodiment of the present invention performs data reading. Here, description will be given as to a case where memory cells MCA and MCB are the data reading targets.

Referring to FIG. 26, in an initial state, a potential of each of bit lines BL0, BL1, source line SL, word line WL1, select gate lines SGD1, SGS1 is 0V, for example.

At time point t8, bit lines BL0, BL1 are precharged and each potential rises to precharge voltage Vpcg. Also, voltage Vrd is applied to select gate lines SGD1, SGS1. Then, N channel MOS transistors TR2A, TR23A, TR2B, TR23B enter an on state.

Here, it is assumed that memory cell MCA is in a programmed state, i.e., a written state, while memory cell MCB is in an erased state. In memory cell MCA, since the threshold voltage is greater than the voltage of word line WL1, N channel MOS transistor TR1A is in an off state. Accordingly, a current does not flow between bit line BL0 and source line SL, whereby from time point t8 to time point t9, the potential of bit line BL0 does not become low but remains at precharge voltage Vpcg. On the other hand, in memory cell MCB, since the threshold voltage is smaller than the voltage of word line WL1, N channel MOS transistor TR1B is in an on state. Accordingly, a current passes between bit line BL1 and source line SL1, whereby the potential of bit line BL1 becomes smaller than precharge voltage Vpcg. Accordingly, by determining a potential of each of bit lines BL0 and BL1 at time point t9, the storage data of memory cells MCA and MCB can be read.

Next, from time point t9 to time point t10, bit lines BL0, BL1 are discharged and each potential becomes 0V. Then, applying of voltage Vrd to select gate lines SGD1 and SGS1 is stopped, and each potential of select gate lined SGD1, SGS1 becomes 0V.

The rest of the configuration and operation are the same as in the semiconductor device according to the first embodiment, and therefore detailed description is not repeated. Accordingly, semiconductor device 102 of the second embodiment of the present invention is capable of storing data in a nonvolatile manner, preventing an increase in the number of process steps, and being small in size.

In a configuration where N channel MOS transistor TR has the complete isolated type SOI structure such as semiconductor device 101 of the first embodiment of the present invention, if the source potential of N channel MOS transistor TR3 in memory cell MC being not the data writing target is at 0V, a current may pass from bit line BL to source line SL by potential fluctuation in the P type body region of N channel MOS transistor TR3, whereby a write inhibit voltage applied to bit line BL becomes low.

However, in semiconductor device 102 of the second embodiment of the present invention, the body of N channel MOS transistor TR23 is electrically connected to source of N channel MOS transistor TR23. That is, the body of N channel MOS transistor TR23 is fixed to the potential of source line SL. With such a configuration, the write inhibit voltage applied to bit line BL can be prevented from becoming low, whereby erroneous writing of data can be prevented. Additionally, since semiconductor device 102 of the second embodiment of the present invention does not require a plurality of source lines SL, the semiconductor device can be reduced in size and the voltage control can be simplified.

The present invention is applicable to, for example, a system LSI (large Scale Integration), microprocessor or the like that uses an SOI substrate. For example, there is a demand for storing chip-specific ID (Identification) and security data or the like in the semiconductor device even after power supply is stopped, instead of storing them in an element external to the semiconductor device. Furthermore, a system LSI and a microprocessor or the like generally incorporates RAM (Random Access Memory), and there is a demand of storing information on the region replacing a defective region of RAM, as programmed inside the semiconductor device. The semiconductor devices according to the embodiments of the present invention satisfy such demands.

Although the present invention has been described and illustrated in detail, it is clearly understood that the same is by way of illustration and example only and is not to be taken by way of limitation, the scope of the present invention being interpreted by the terms of the appended claims.

What is claimed is:
1. A semiconductor device, comprising:
a first transistor of an SOI (Silicon on Insulator) structure having a source region, a drain region, a body region positioned between said source region and said drain region, and a gate electrode positioned above said body region;
a first capacitor of the SOI structure having a first terminal electrically connected to the gate electrode of said first transistor, and a second terminal;
a second transistor of the SOI structure having a source region electrically connected to the drain region of said first transistor, a drain region, a body region positioned between said source region and said drain region of said second transistor, and a gate electrode positioned above said body region of said second transistor; and
a third transistor of the SOI structure having a source region, a drain region electrically connected to the source region of said first transistor, a body region positioned between said source region and said drain region of said third transistor, and a gate electrode positioned above said body region of said third transistor;
a fourth transistor of the SOI structure having a source region, a drain region, a body region positioned between said source region and said drain region of said fourth transistor, and a gate electrode positioned above said body region of said fourth transistor;
a second capacitor of the SOI structure having a first terminal electrically connected to the gate electrode of said fourth transistor, and a second terminal electrically connected to the second terminal of said first capacitor;
a fifth transistor of the SOI structure having a source region electrically connected to the drain region of said fourth transistor, a drain region, a body region positioned between said source region and said drain region of said fifth transistor, and a gate electrode positioned above said body region of said fifth transistor;
a sixth transistor of the SOI structure having a source region, a drain region electrically connected to the source region of said fourth transistor, a body region positioned between said source region and said drain region of said sixth transistor, and a gate electrode positioned above said body region of said sixth transistor;
a first bit line electrically connected to the drain region of said second transistor;
a second bit line electrically connected to the drain region of said fifth transistor; and
a source line electrically connected to the source region of said third transistor and the source region of said sixth transistor, wherein
said semiconductor device stores data in a nonvolatile manner in accordance with carriers accumulated in a first node electrically connecting the gate electrode of said first transistor and the first terminal of said first capacitor,
said semiconductor device stores data in a nonvolatile manner in accordance with carriers accumulated in a second node electrically connecting the gate electrode of said fourth transistor and the first terminal of said second capacitor, and
the body region of said third transistor is electrically connected to the source region of said third transistor, and the body region of said sixth transistor is electrically connected to the source region of said sixth transistor,
said semiconductor device further comprising:
an insulation film; and
an active layer formed on said insulation film, wherein
in said active layer, the first semiconductor region, the second semiconductor region and the body region of each of said first capacitor and said second capacitor are formed, and in said active layer, the drain region, the source region and the body region of each of said first transistor, said second transistor, said third transistor, said fourth transistor, said fifth transistor, and said sixth transistor are formed, said semiconductor device further comprising:

an isolation region formed on a surface of said active layer with a gap between said insulation film; and a fourth semiconductor region that is adjacent to the body region of said third transistor and the body region of said sixth transistor, that is formed in a region including a portion between said isolation region and said insulation film, and that is of a conductivity type identical to the body region of said third transistor and the body region of said sixth transistor, wherein the body region of said third transistor is electrically connected to the source region of said third transistor via said fourth semiconductor region, and the body region of said sixth transistor is electrically connected to the source region of said sixth transistor via said fourth semiconductor region.

2. A semiconductor device, comprising:

a first transistor of an SOI (Silicon on Insulator) structure having a source region, a drain region, a body region positioned between said source region and said drain region, and a gate electrode positioned above said body region;

a first capacitor of the SOI structure having a first terminal electrically connected to the gate electrode of said first transistor, and a second terminal;

a second transistor of the SOI structure having a source region electrically connected to the drain region of said first transistor, a drain region, a body region positioned between said source region and said drain region of said second transistor, and a gate electrode positioned above said body region of said second transistor; and a third transistor of the SOI structure having a source region, a drain region electrically connected to the source region of said first transistor, a body region positioned between said source region and said drain region of said third transistor, and a gate electrode positioned above said body region of said third transistor; wherein said semiconductor device stores data in a nonvolatile manner in accordance with carriers accumulated in a first node electrically connecting the gate electrode of said first transistor and the first terminal of said first capacitor, said semiconductor device further comprising:

a bit line electrically connected to the drain region of said second transistor;

a source line electrically connected to the source region of said third transistor; and a word line electrically connected to the second terminal of said first capacitor; wherein said source line is arranged substantially parallel to said bit line, said word line is arranged substantially perpendicularly to said bit line, said first transistor is arranged corresponding to an intersection of said bit line and said word line, said second transistor and said third transistor are arranged on both sides of said first transistor along said bit line, and said first capacitor is arranged corresponding to an intersection of said source line and said word line.

3. A semiconductor device, comprising:

a first transistor of an SOI (Silicon on Insulator) structure having a source region, a drain region, a body region positioned between said source region and said drain region, and a gate electrode positioned above said body region;

a first capacitor of the SOI structure having a first terminal electrically connected to the gate electrode of said first transistor, and a second terminal;

a second transistor of the SOI structure having a source region electrically connected to the drain region of said first transistor, a drain region, a body region positioned between said source region and said drain region of said second transistor, and a gate electrode positioned above said body region of said second transistor; and a third transistor of the SOI structure having a source region, a drain region electrically connected to the source region of said first transistor, a body region positioned between said source region and said drain region of said third transistor, and a gate electrode positioned above said body region of said third transistor; wherein said semiconductor device stores data in a nonvolatile manner in accordance with carriers accumulated in a first node electrically connecting the gate electrode of said first transistor and the first terminal of said first capacitor, said semiconductor device further comprising:

a bit line electrically connected to the drain region of said second transistor;

a source line electrically connected to the source region of said third transistor; and a word line electrically connected to the second terminal of said first capacitor, wherein said word line and said source line are arranged substantially perpendicularly to said bit line, said first transistor is arranged corresponding to an intersection of said bit line and said word line, said second transistor and said third transistor are arranged on both sides of said first transistor along said bit line, and said first capacitor is arranged along said word line.

* * * * *